(12) United States Patent
Oda

(10) Patent No.: US 10,050,122 B2
(45) Date of Patent: Aug. 14, 2018

(54) SEMICONDUCTOR DEVICE AND MANUFACTURING METHOD OF THE SAME

(71) Applicant: Renesas Electronics Corporation, Tokyo (JP)

(72) Inventor: Hidekazu Oda, Kanagawa (JP)

(73) Assignee: Renesas Electronics Corporation, Tokyo ( * ) Notice: Subject to any disclaimer, the term of this patent is extended or adjusted under 35 U.S.C. 154(b) by 0 days.

(21) Appl. No.: 15/299,216

(22) Filed: Oct. 20, 2016

(65) Prior Publication Data
US 2017/0040226 A1    Feb. 9, 2017

Related U.S. Application Data

(62) Division of application No. 14/739,065, filed on Jun. 15, 2015, now Pat. No. 9,508,598.

(30) Foreign Application Priority Data

Jun. 13, 2014    (JP) .................................. 2014-122894

(51) Int. Cl.
*H01L 29/66* (2006.01)
*H01L 21/8234* (2006.01)
(Continued)

(52) U.S. Cl.
CPC ...... *H01L 29/6656* (2013.01); *H01L 21/2652* (2013.01); *H01L 21/26513* (2013.01);
(Continued)

(58) Field of Classification Search
CPC ......... H01L 21/8232; H01L 21/823418; H01L 21/823425; H01L 21/823814;
(Continued)

(56) References Cited

U.S. PATENT DOCUMENTS 5,341,028 A    8/1994  Yamaguchi et al.
6,562,676 B1   5/2003  Ju
(Continued)

FOREIGN PATENT DOCUMENTS

JP    04-147629 A    5/1992
JP    2003-100902 A  4/2003
(Continued)

OTHER PUBLICATIONS

Fenouillet-Beranger et al., "FDSOI devices with thin BOX and ground plane integration for 32 nm node and below," Solid-State Electronics, Elsevier Science Publisher, Barkings, GB, vol. 53, No. 7, Jul. 1, 2009, pp. 730-734.
(Continued)

*Primary Examiner* — Eduardo A Rodela
(74) *Attorney, Agent, or Firm* — Shapiro, Gabor and Rosenberger, PLLC

(57) ABSTRACT

To enhance reliability and performance of a semiconductor device that has a fully-depleted SOI transistor, while a width of an offset spacer formed on side walls of a gate electrode is configured to be larger than or equal to a thickness of a semiconductor layer and smaller than or equal to a thickness of a sum total of a thickness of the semiconductor layer and a thickness of an insulation film, an impurity is ion-implanted into the semiconductor layer that is not covered by the gate electrode and the offset spacer. Thus, an extension layer formed by ion implantation of an impurity is kept from entering into a channel from a position lower than the end part of the gate electrode.

16 Claims, 27 Drawing Sheets

(51) Int. Cl.
  *H01L 21/84* (2006.01)
  *H01L 29/786* (2006.01)
  *H01L 27/12* (2006.01)
  *H01L 21/265* (2006.01)
  *H01L 21/8238* (2006.01)
  *H01L 27/092* (2006.01)
  *H01L 29/08* (2006.01)
  *H01L 29/10* (2006.01)
  *H01L 21/822* (2006.01)

(52) U.S. Cl.
  CPC .. *H01L 21/8221* (2013.01); *H01L 21/823412* (2013.01); *H01L 21/823418* (2013.01); *H01L 21/823468* (2013.01); *H01L 21/823814* (2013.01); *H01L 21/84* (2013.01); *H01L 27/0922* (2013.01); *H01L 27/1203* (2013.01); *H01L 27/1207* (2013.01); *H01L 29/0847* (2013.01); *H01L 29/1045* (2013.01); *H01L 29/6653* (2013.01); *H01L 29/6659* (2013.01); *H01L 29/66537* (2013.01); *H01L 29/66575* (2013.01); *H01L 29/66598* (2013.01); *H01L 29/66772* (2013.01); *H01L 29/78654* (2013.01); *H01L 21/823864* (2013.01); *H01L 29/665* (2013.01); *H01L 29/78621* (2013.01)

(58) Field of Classification Search
  CPC ..... H01L 21/823864; H01L 21/823468; H01L 29/41783; H01L 29/6653; H01L 29/66553; H01L 29/6656; H01L 29/66575; H01L 29/29; H01L 29/76; H01L 29/772; H01L 21/7624; H01L 21/76264; H01L 27/1203; H01L 27/1207
  See application file for complete search history.

(56) References Cited

U.S. PATENT DOCUMENTS

| | | | |
|---|---|---|---|
| 8,940,640 B2* | 1/2015 | Xiao | H01L 29/7848 257/E21.215 |
| 2003/0059983 A1 | 5/2003 | Ota et al. | |
| 2005/0048752 A1 | 3/2005 | Doris et al. | |
| 2005/0095796 A1 | 5/2005 | van Bentum et al. | |
| 2007/0045729 A1 | 3/2007 | Hoentschel et al. | |
| 2007/0158743 A1 | 7/2007 | Chang et al. | |
| 2008/0105925 A1* | 5/2008 | Pae | H01L 21/84 257/347 |
| 2009/0108352 A1 | 4/2009 | Majumdar et al. | |
| 2009/0246922 A1 | 10/2009 | Wu et al. | |
| 2010/0032761 A1 | 2/2010 | Ding et al. | |
| 2010/0237410 A1* | 9/2010 | Zhu | H01L 29/1045 257/335 |
| 2011/0084315 A1 | 4/2011 | Bedell et al. | |
| 2011/0230027 A1 | 9/2011 | Kim et al. | |
| 2012/0104498 A1 | 5/2012 | Majumdar et al. | |
| 2012/0280251 A1 | 11/2012 | Dube et al. | |
| 2013/0087855 A1 | 4/2013 | Makiyama et al. | |
| 2013/0161751 A1 | 6/2013 | Chung et al. | |
| 2013/0161763 A1 | 6/2013 | Ando et al. | |
| 2013/0264644 A1* | 10/2013 | Tsunomura | H01L 27/1203 257/350 |
| 2013/0316506 A1 | 11/2013 | Cheng et al. | |
| 2014/0024181 A1* | 1/2014 | Adam | H01L 21/84 438/154 |
| 2014/0042529 A1 | 2/2014 | Yamamoto et al. | |
| 2015/0318377 A1 | 11/2015 | Cheng et al. | |
| 2016/0365850 A1* | 12/2016 | Hurwitz | H01L 27/1203 |

FOREIGN PATENT DOCUMENTS

| | | |
|---|---|---|
| JP | 2013-084766 A | 5/2013 |
| JP | 2014-38878 A | 2/2014 |
| WO | WO 2014/079296 A1 | 5/2014 |

OTHER PUBLICATIONS

Ishigaki et al., "Silicon on thin BOX (SOTB) CMOS for ultralow standby power with forward-biasing performance booster," Solid-State Electronics, Elsevier Science Publisher, Barkings, GB, vol. 53, No. 7, Jul. 1, 2009, pp. 717-722.

Bansal, et al., "Optimal Dual-VT Design in Sub-100 Nanometer PDSOI and Double-Gate Technologies", VLSI Design, 2008, 21$^{st}$ International Conference ON, IEEE, Piscataway, NJ, USA, Jan. 4, 2008, pp. 125-130.

Extended European Search Report dated Oct. 15, 2015, in European Application No. 15170863.3.

Office Action dated Oct. 3, 2017, in Japanese Patent Application No. 2014-122894.

* cited by examiner

US 10,050,122 B2

SEMICONDUCTOR DEVICE AND MANUFACTURING METHOD OF THE SAME

CROSS-REFERENCE TO RELATED APPLICATION

The present application claims priority from Japanese Patent Application No. 2014-122894 filed on Jun. 13, 2014, the content of which is hereby incorporated by reference into this application.

TECHNICAL FIELD OF THE INVENTION

The present invention relates to a semiconductor device and a manufacturing technology thereof, and can be used suitably for a semiconductor device using, for example, an SOI (Silicon On Insulator) substrate and a manufacturing method thereof.

BACKGROUND OF THE INVENTION

For example, a technology where after an extension layer of an nMOS transistor is formed in a low voltage nMOS region, an offset spacer is formed in side surfaces of a gate electrode, and after that, an extension layer of a pMOS transistor is formed in a low voltage pMOS region is disclosed in Japanese Patent Application Laid-Open Publication No. 2003-100902 (Patent Document 1).

In addition, a semiconductor device that includes a gate electrode formed on a semiconductor layer of an SOI substrate via a gate insulation film, a side wall spacer formed on side walls of the gate electrode, a semiconductor layer for a source-drain that is made to be grown epitaxially on a semiconductor layer, and a sidewall spacer formed on side walls of the semiconductor layer for the source-drain is disclosed in Japanese Patent Application Laid-Open Publication No. 2014-038878 (Patent Document 2).

SUMMARY OF THE INVENTION

As to a fully-depleted SOI transistor, because overlapping (gate overlapping) between a gate electrode and a source-drain becomes large in association with fining, deterioration etc. of a switching speed due to deterioration of DIBL (Drain Induced Barrier Lowering), increase of a gate leakage current, increase of GIDL (Gate Induced Drain Leak) and increase of a parasitic capacitance have been concerned about.

Other problems and novel characteristics of the present invention will be apparent from the description of the present specification and the accompanying drawings.

According to an embodiment, in a semiconductor device using an SOI substrate that has a semiconductor substrate, an insulation film on the semiconductor substrate and a semiconductor layer on the insulation film, a width of an offset spacer formed on side walls of a gate electrode of a fully-depleted SOI transistor is configured to be larger than or equal to a thickness of the semiconductor layer and smaller than or equal to a thickness of a sum total of the semiconductor layer and the insulation film. Then, an extension layer of the fully-depleted SOI transistor is formed by ion implanting an impurity into the semiconductor layer using the gate electrode and the offset spacer as a mask.

According to an embodiment, reliability and performance of a semiconductor device that has the fully-depleted SOI transistor can be enhanced.

BRIEF DESCRIPTIONS OF THE DRAWINGS

Figure 3A:
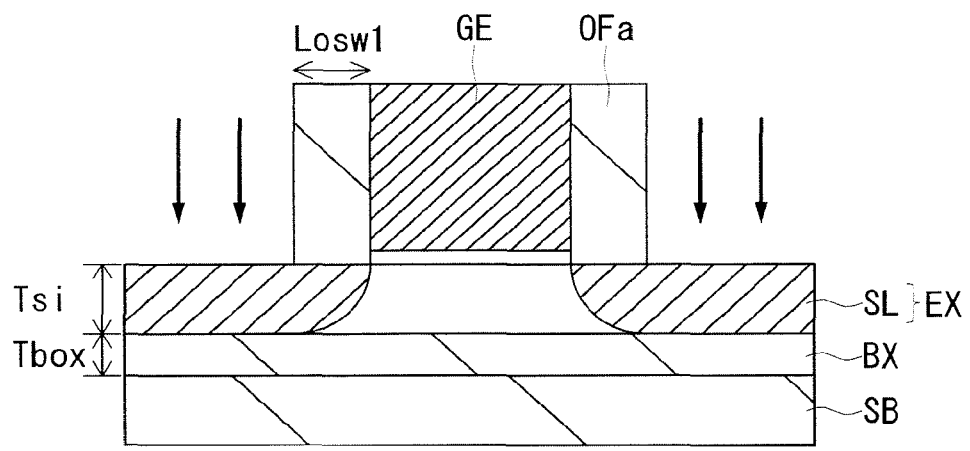
FIG. 3A is a schematic cross-sectional view illustrating a configuration of an extension layer of a second fully-depleted SOI transistor according to the present embodiment, enlarging a part of a second fully-depleted n-channel SOI transistor.
Figure 3B:
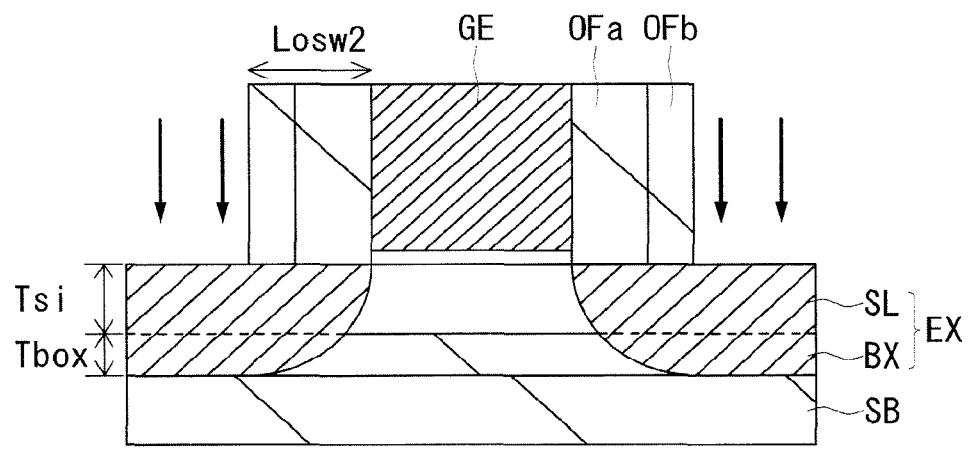
Figure 4A:
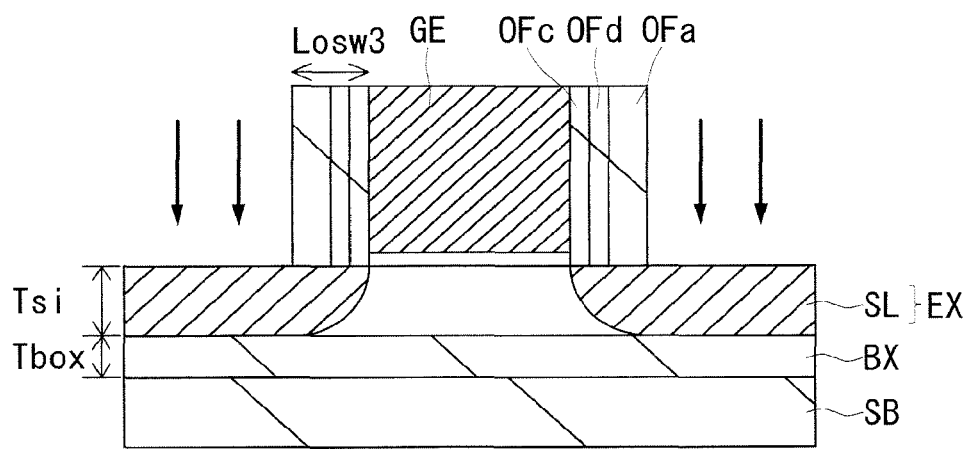
Figure 4B:
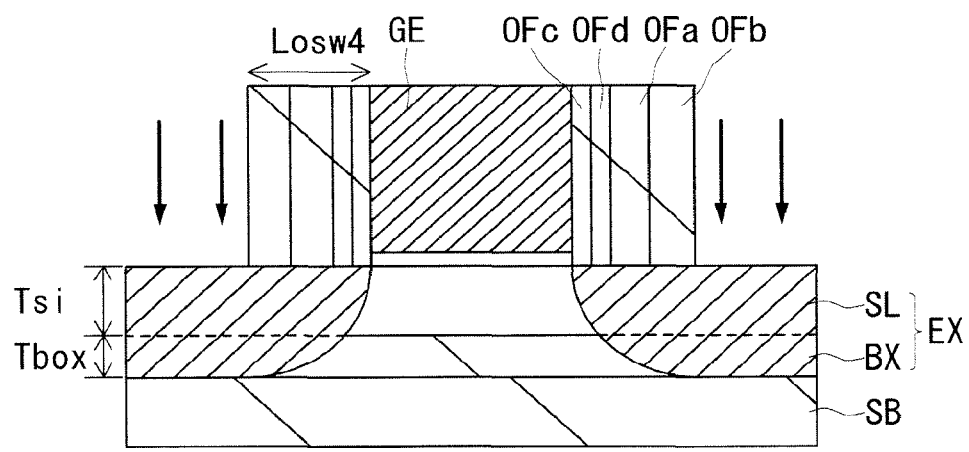
Figure 5:
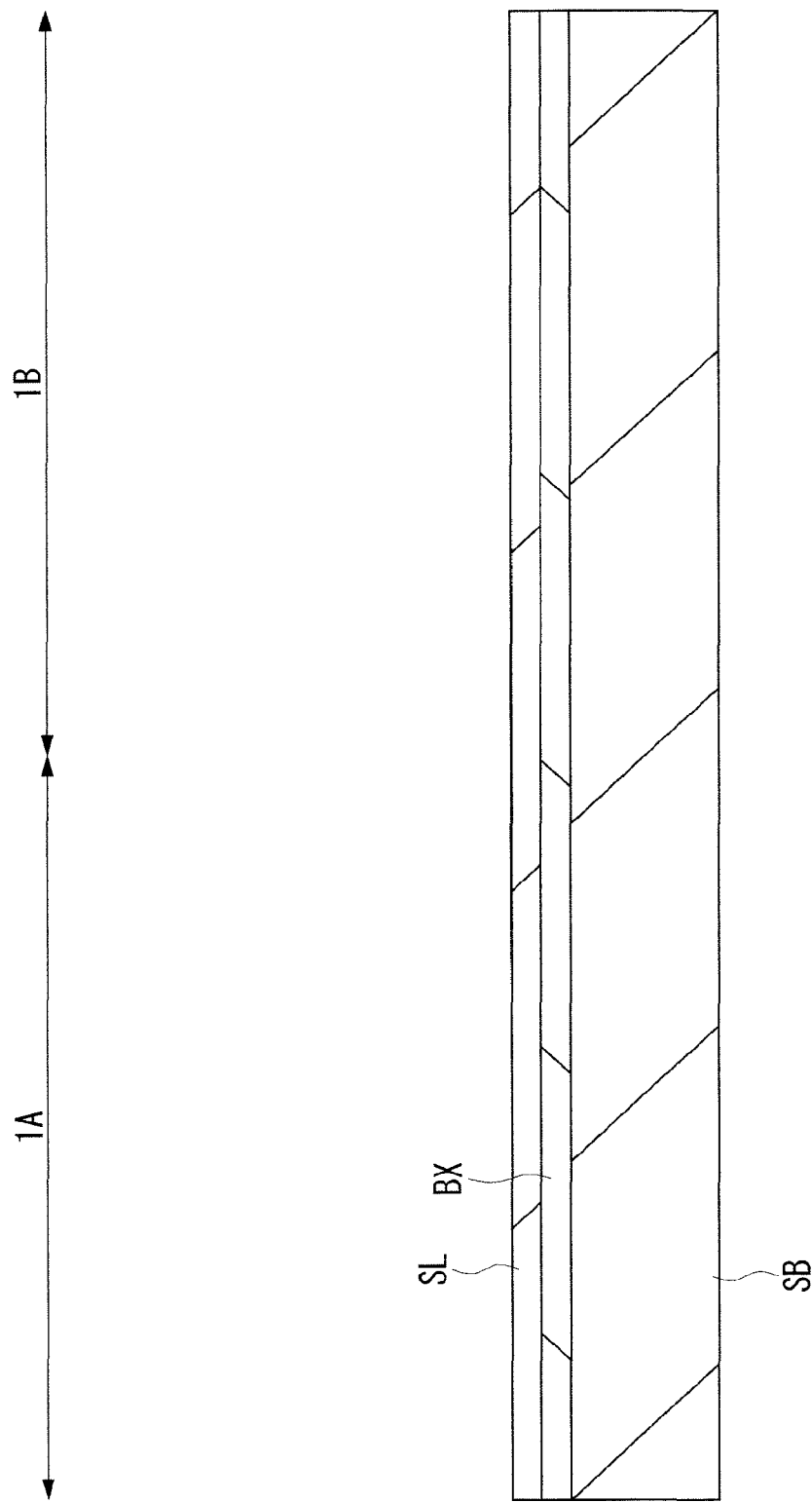
Figure 6:
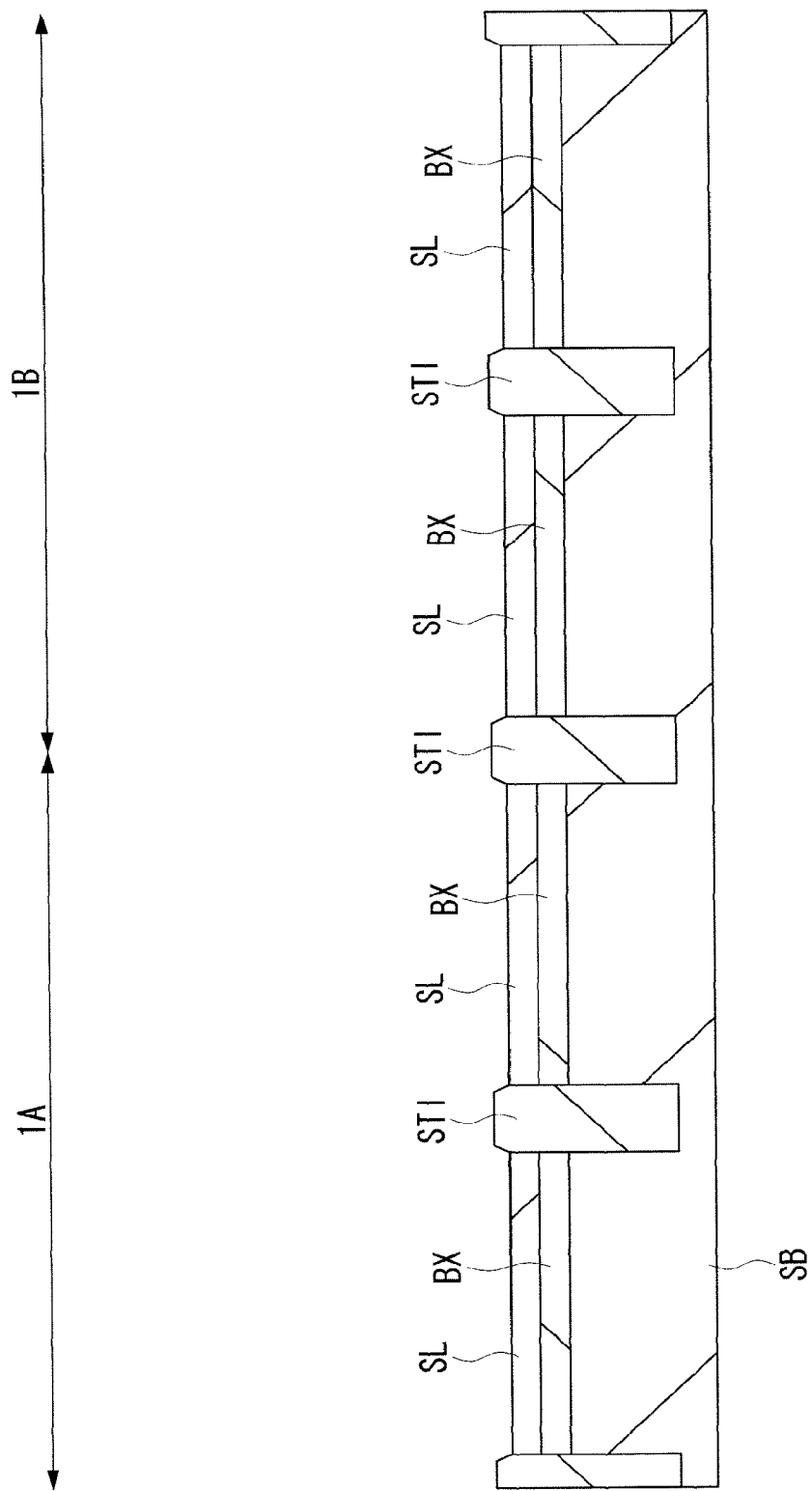
Figure 7:
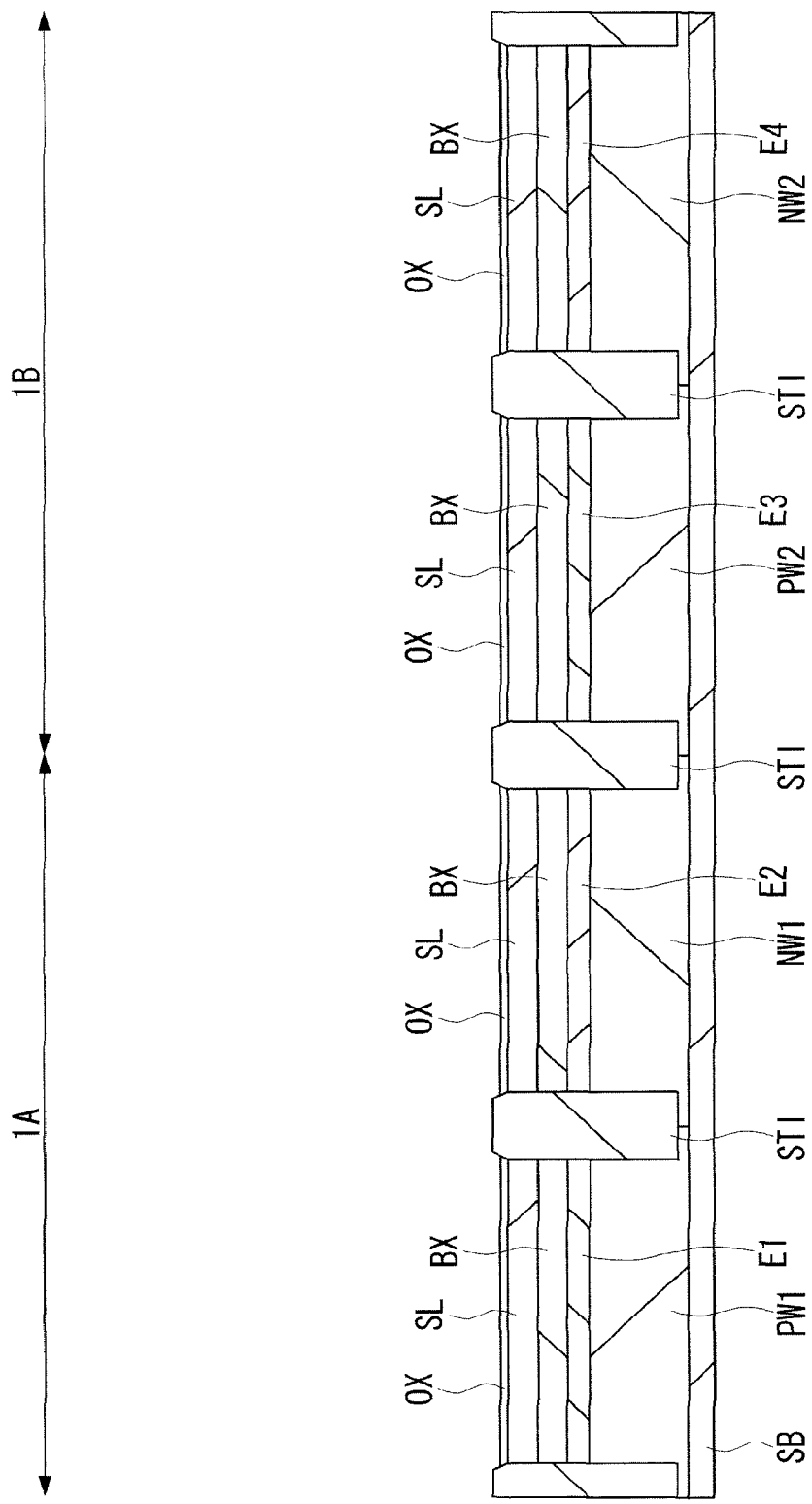
Figure 8:
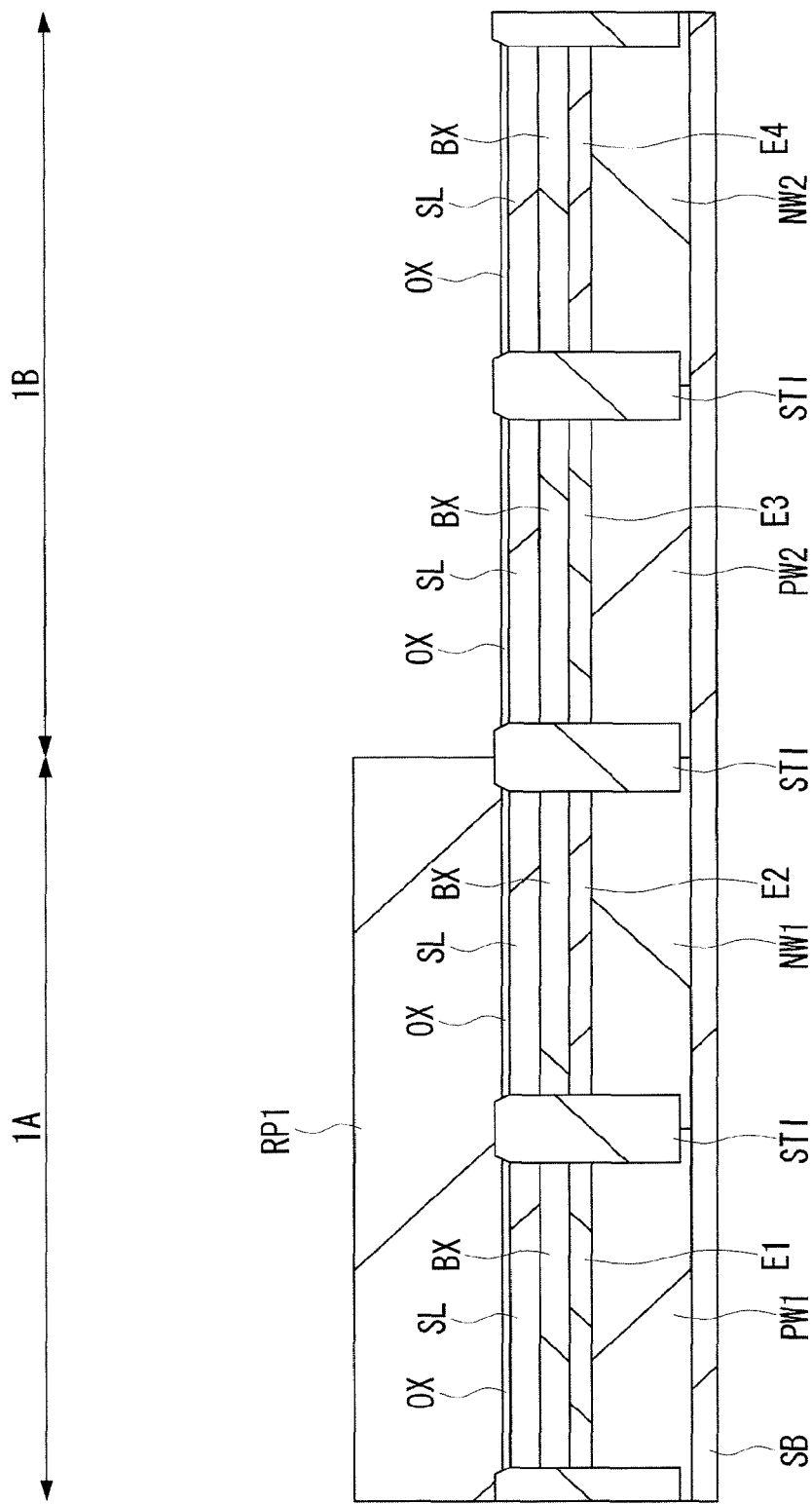
Figure 9:
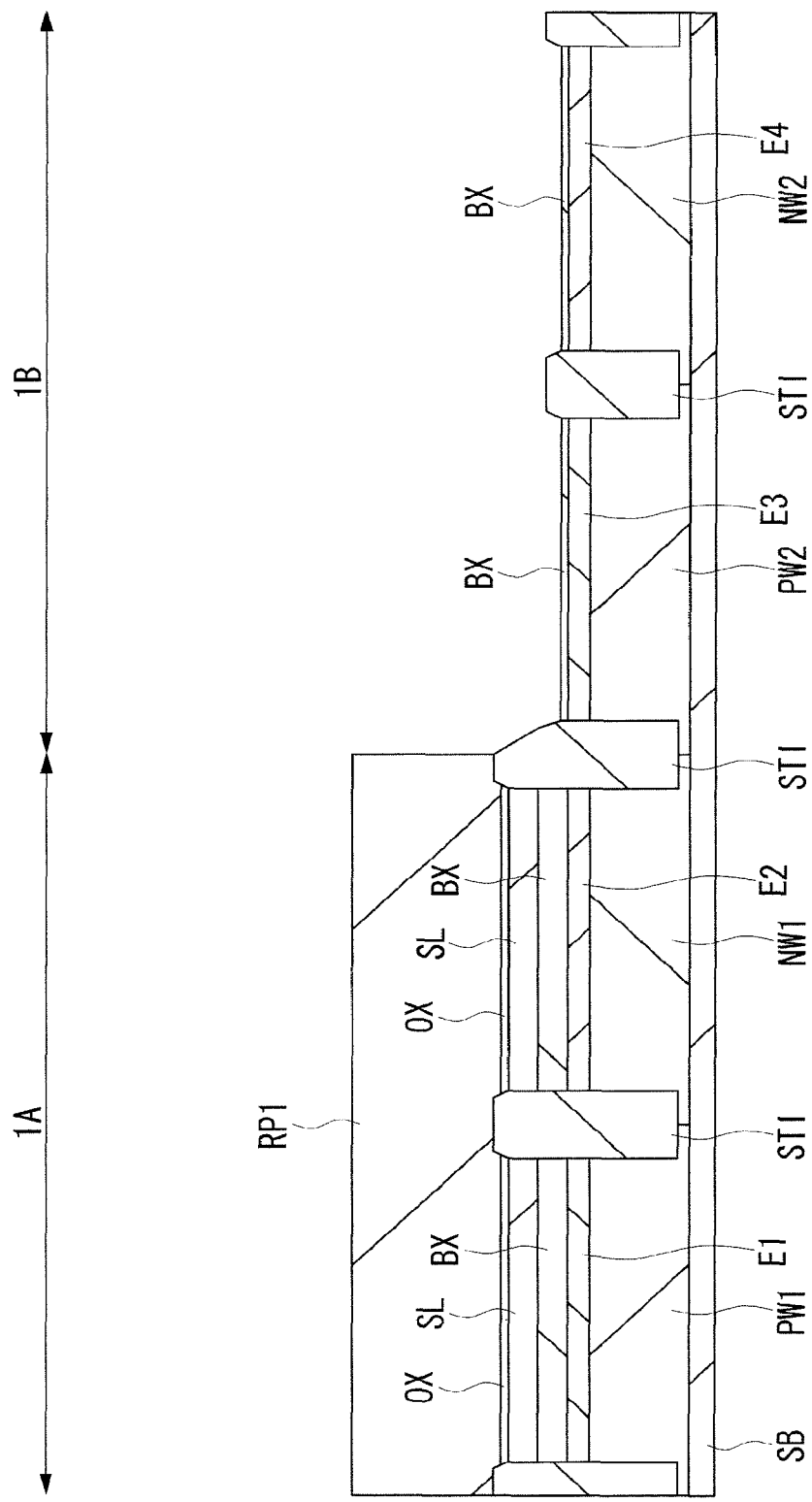
Figure 10:
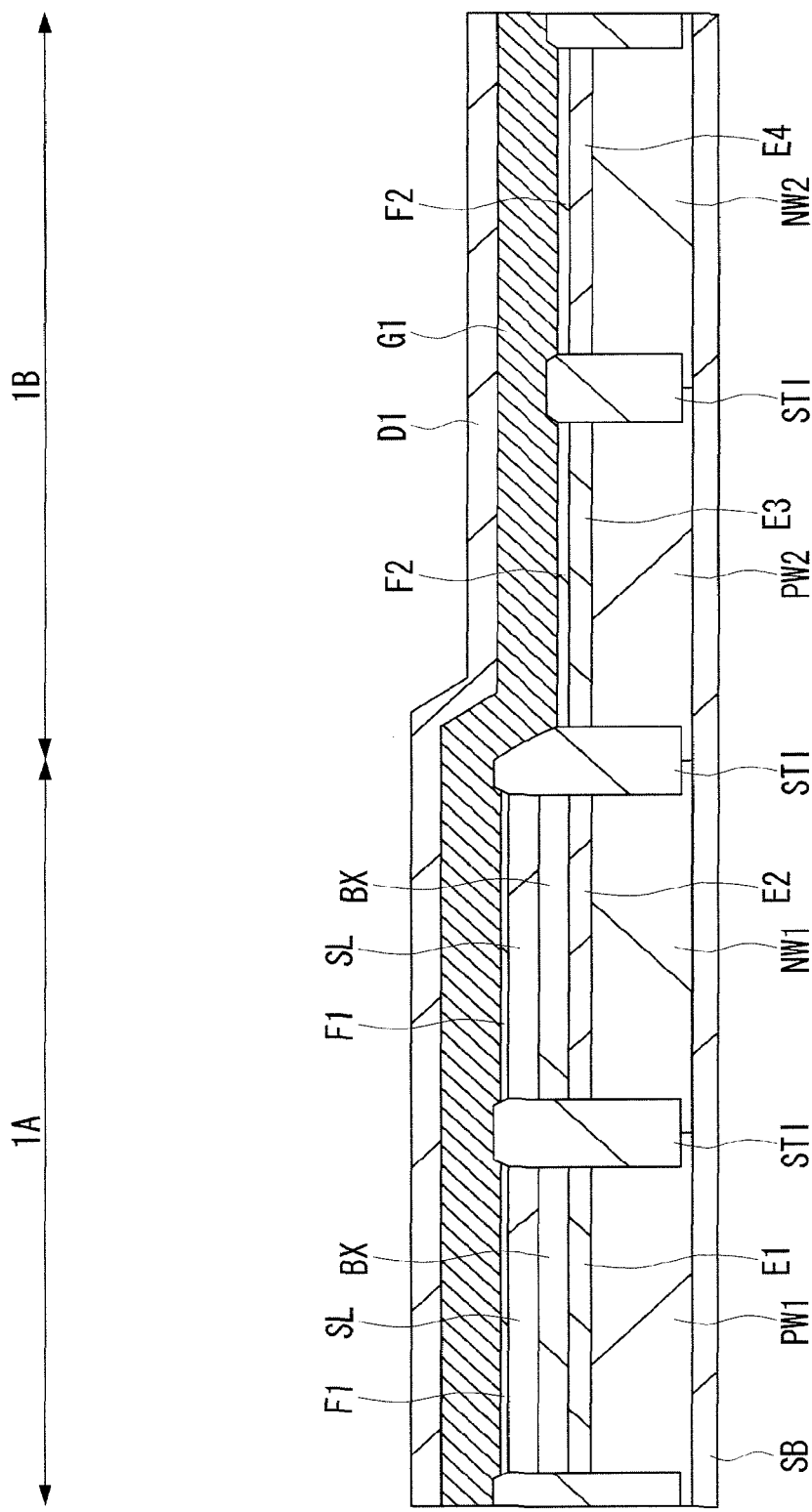
Figure 11:
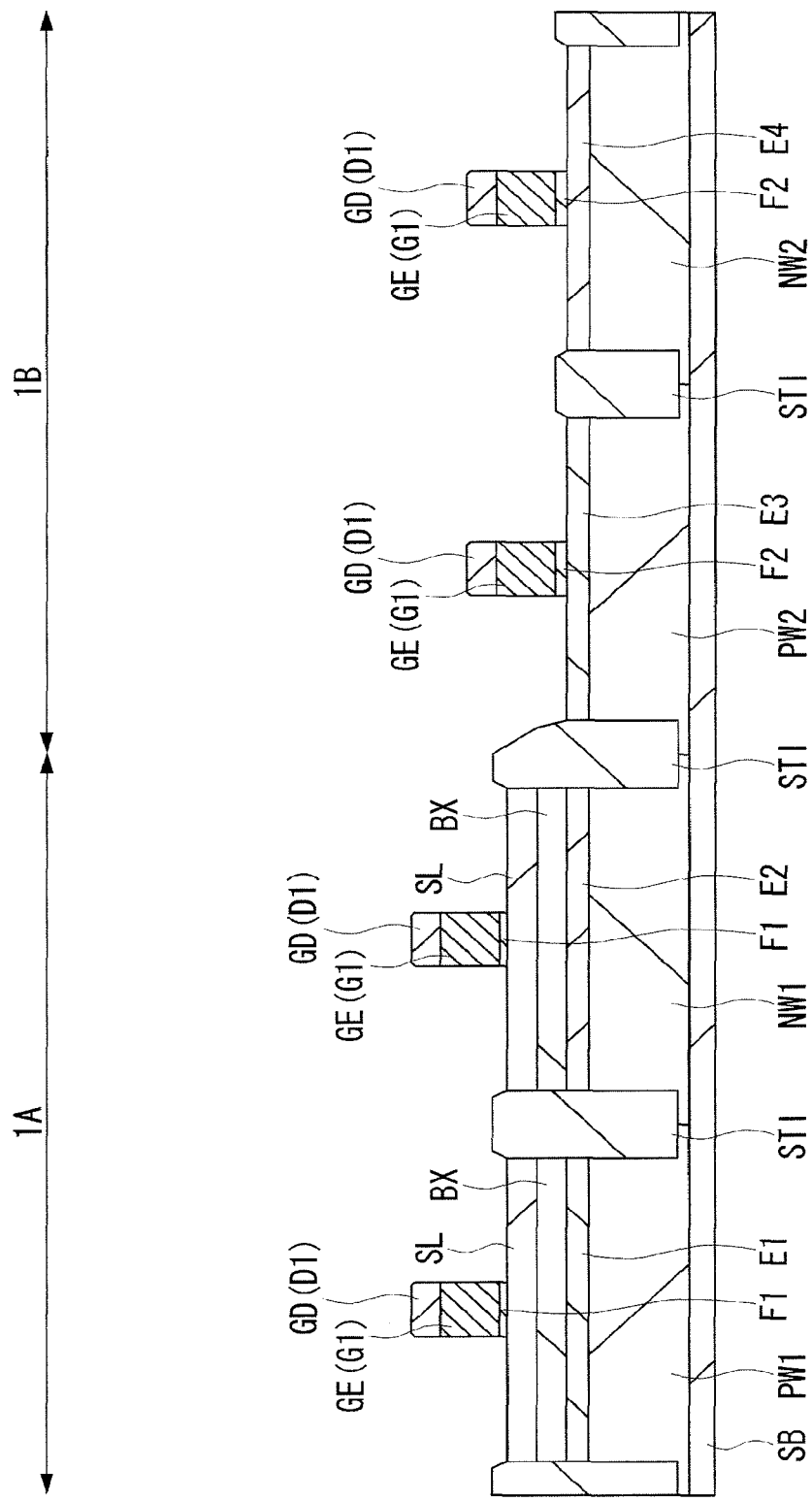
Figure 12:
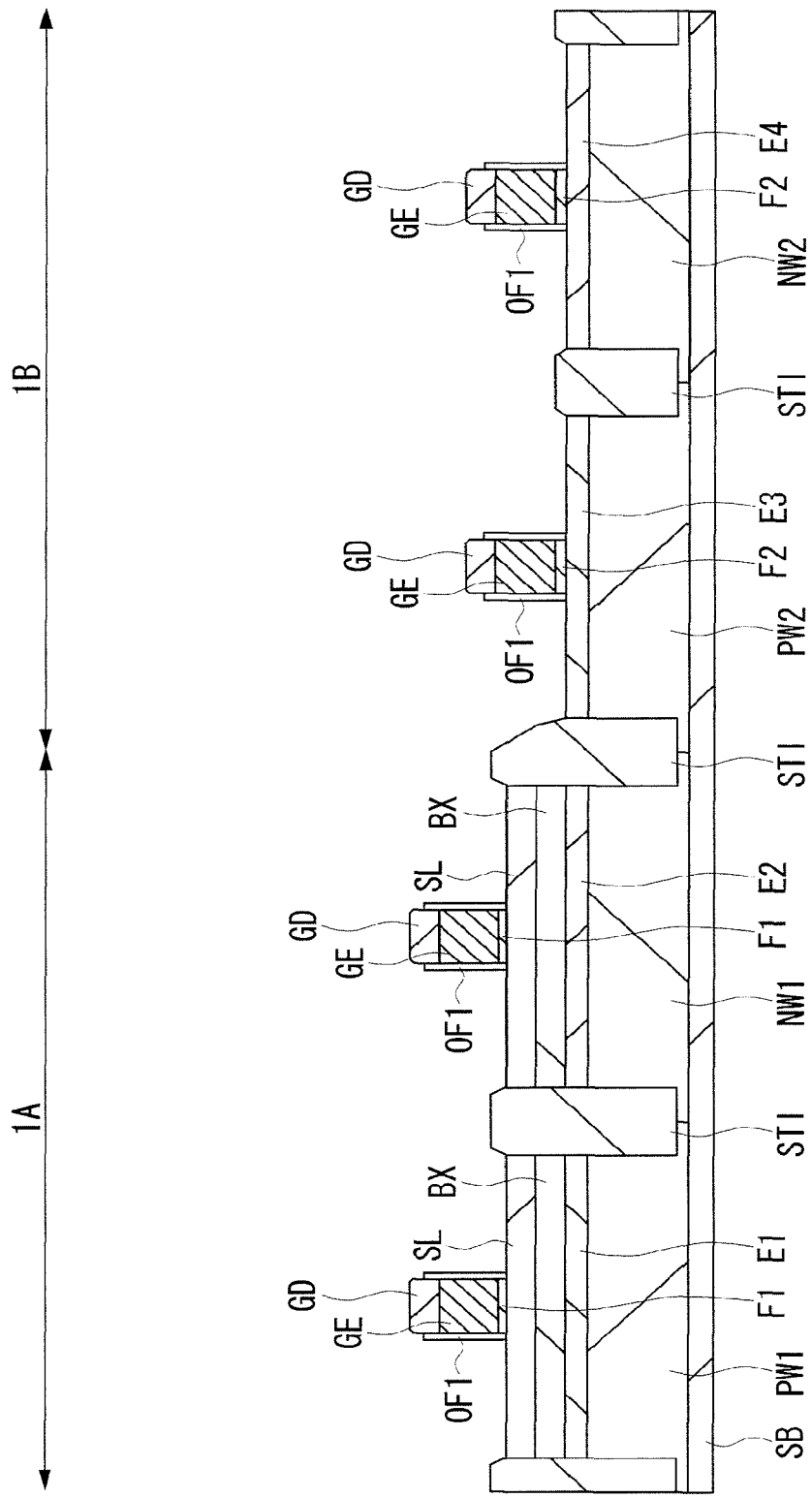
Figure 13:
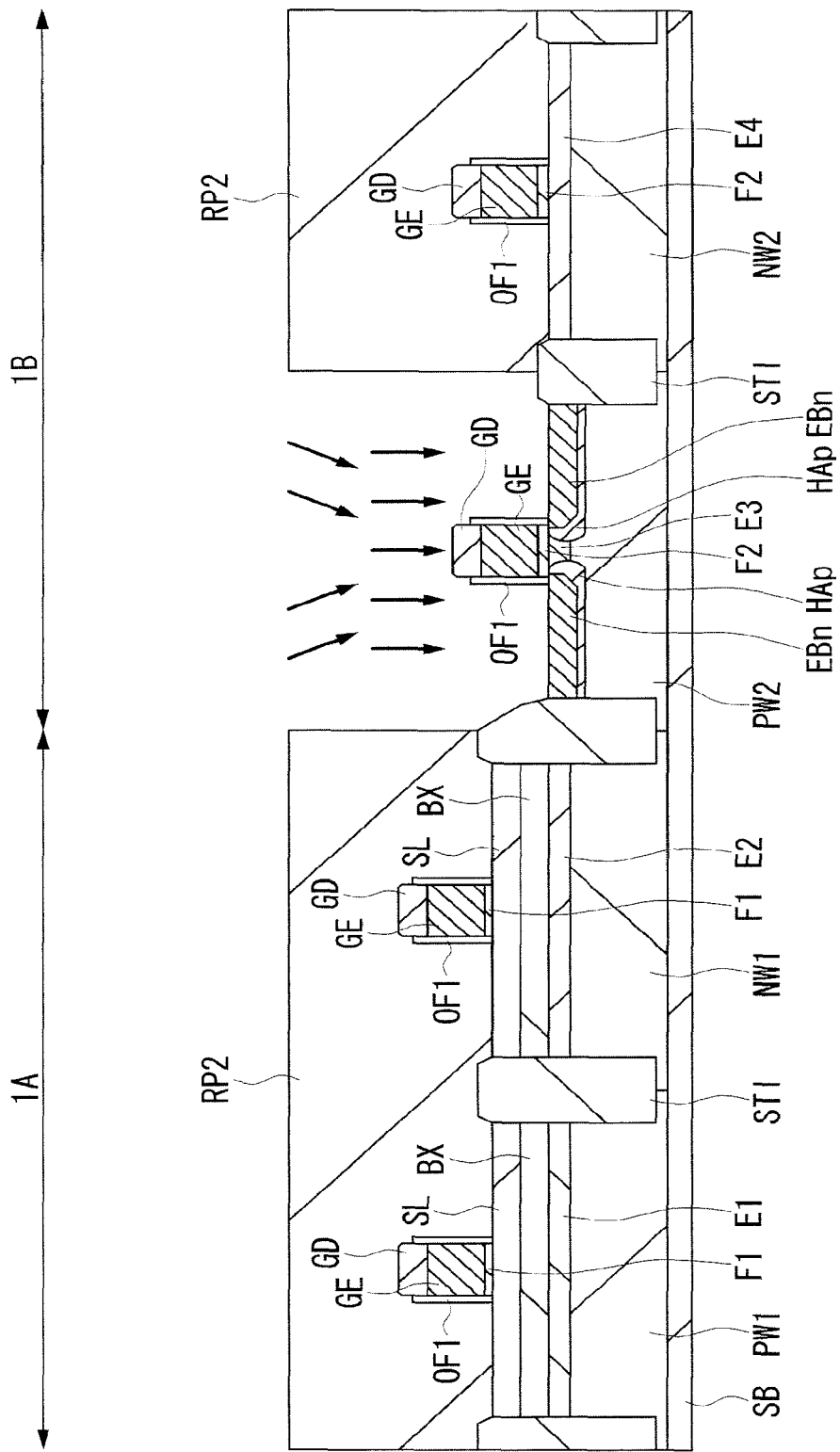
Figure 14:
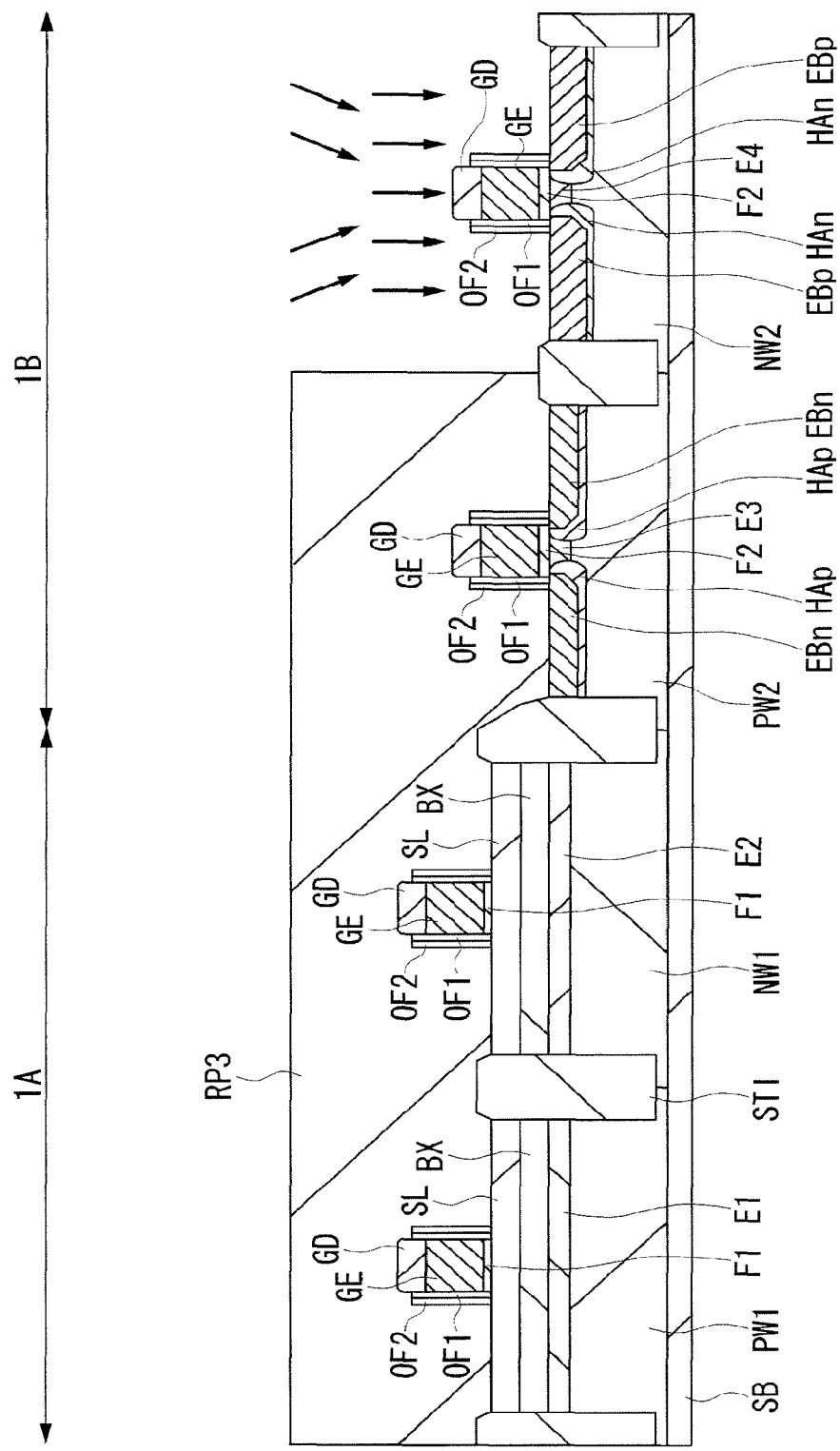
Figure 15:
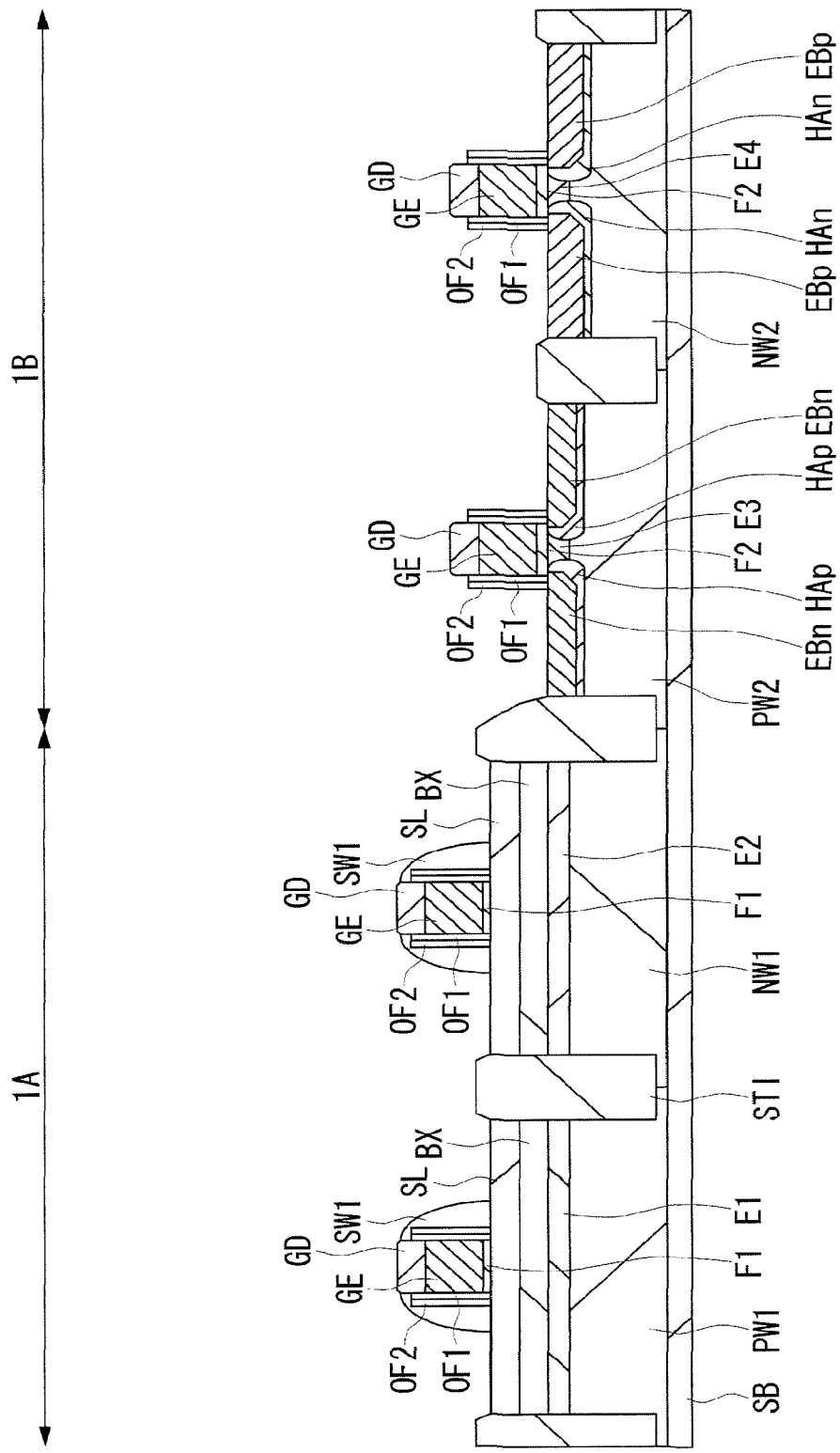
Figure 16:
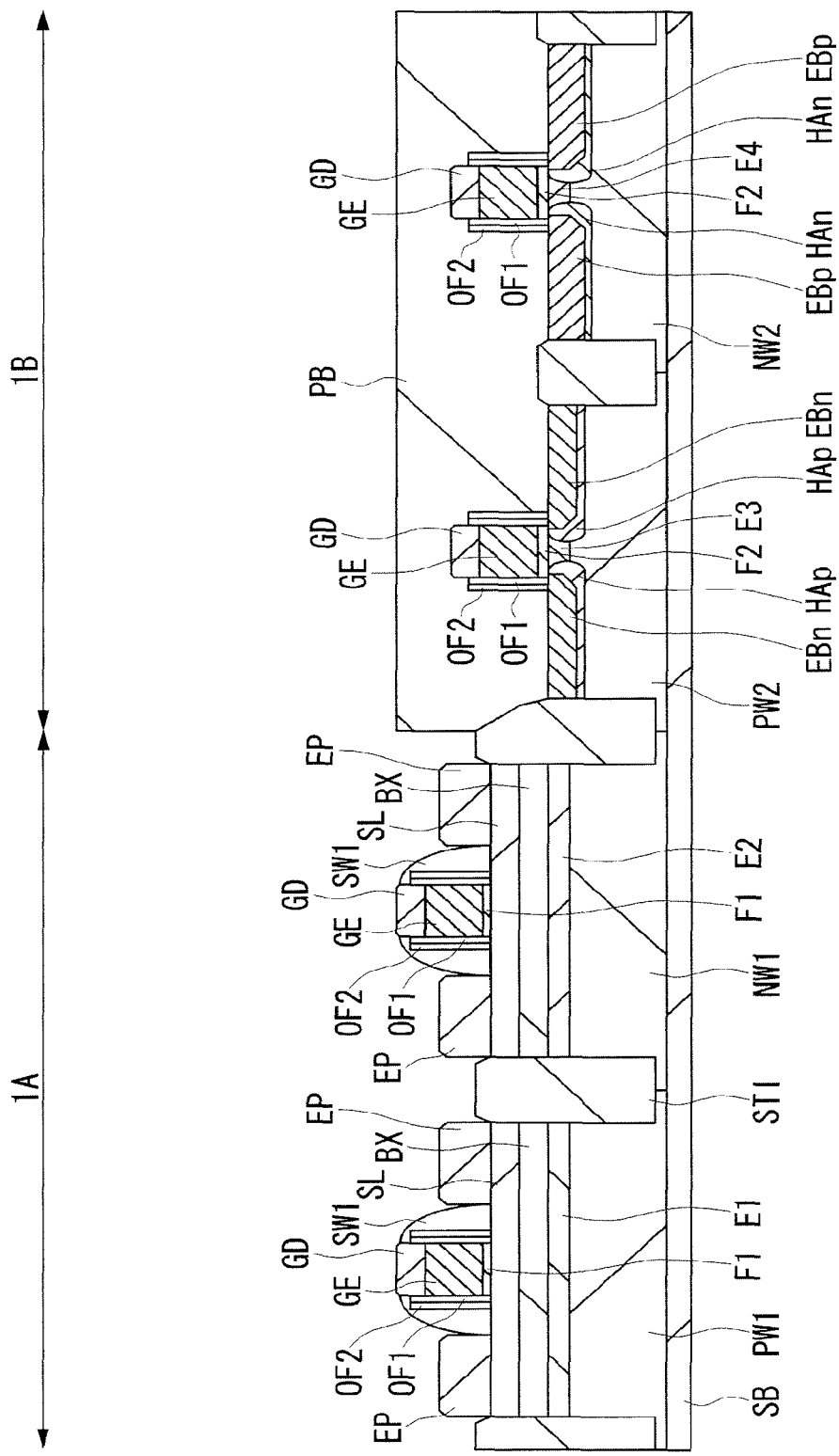
Figure 17:
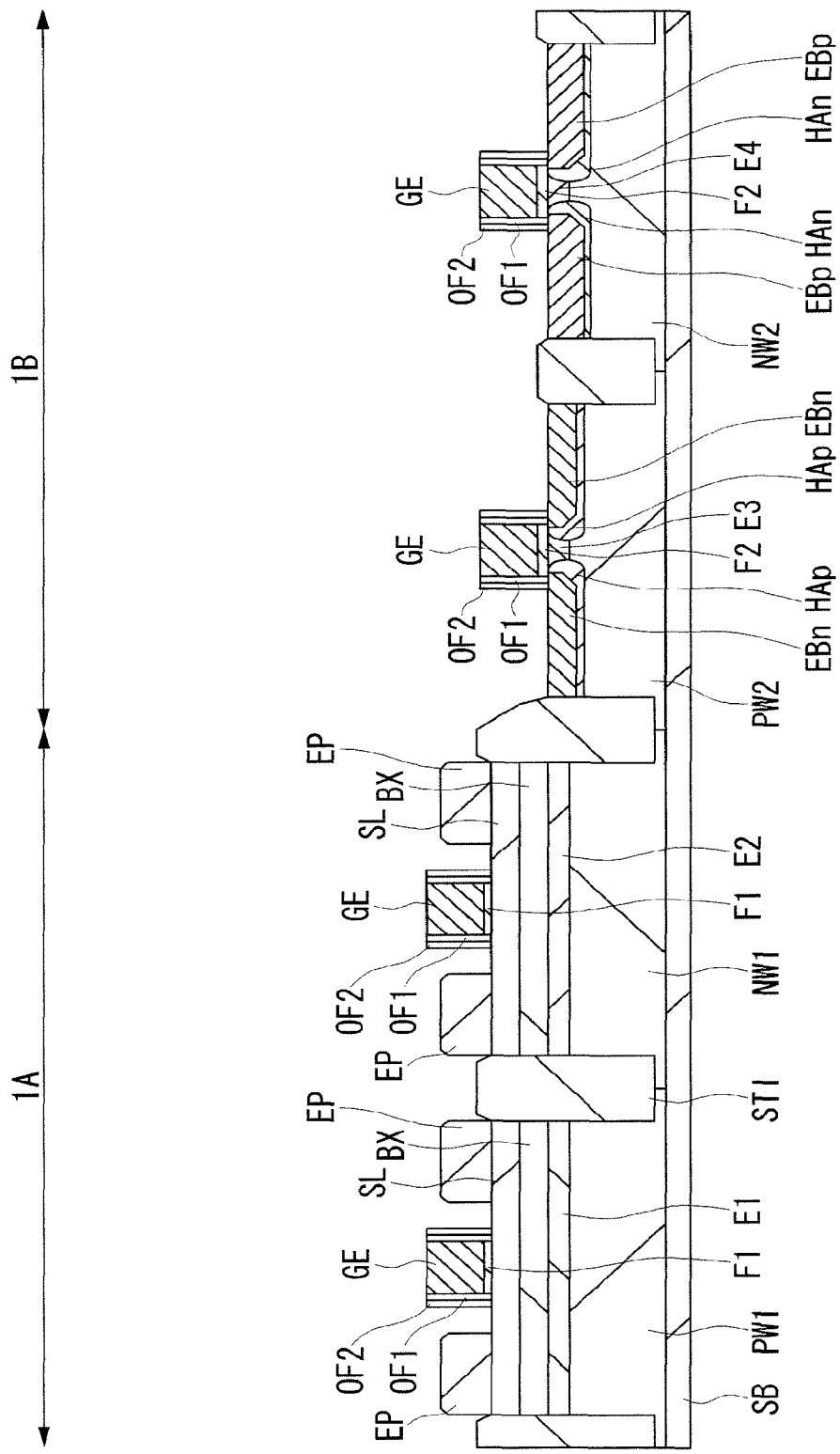
Figure 18:
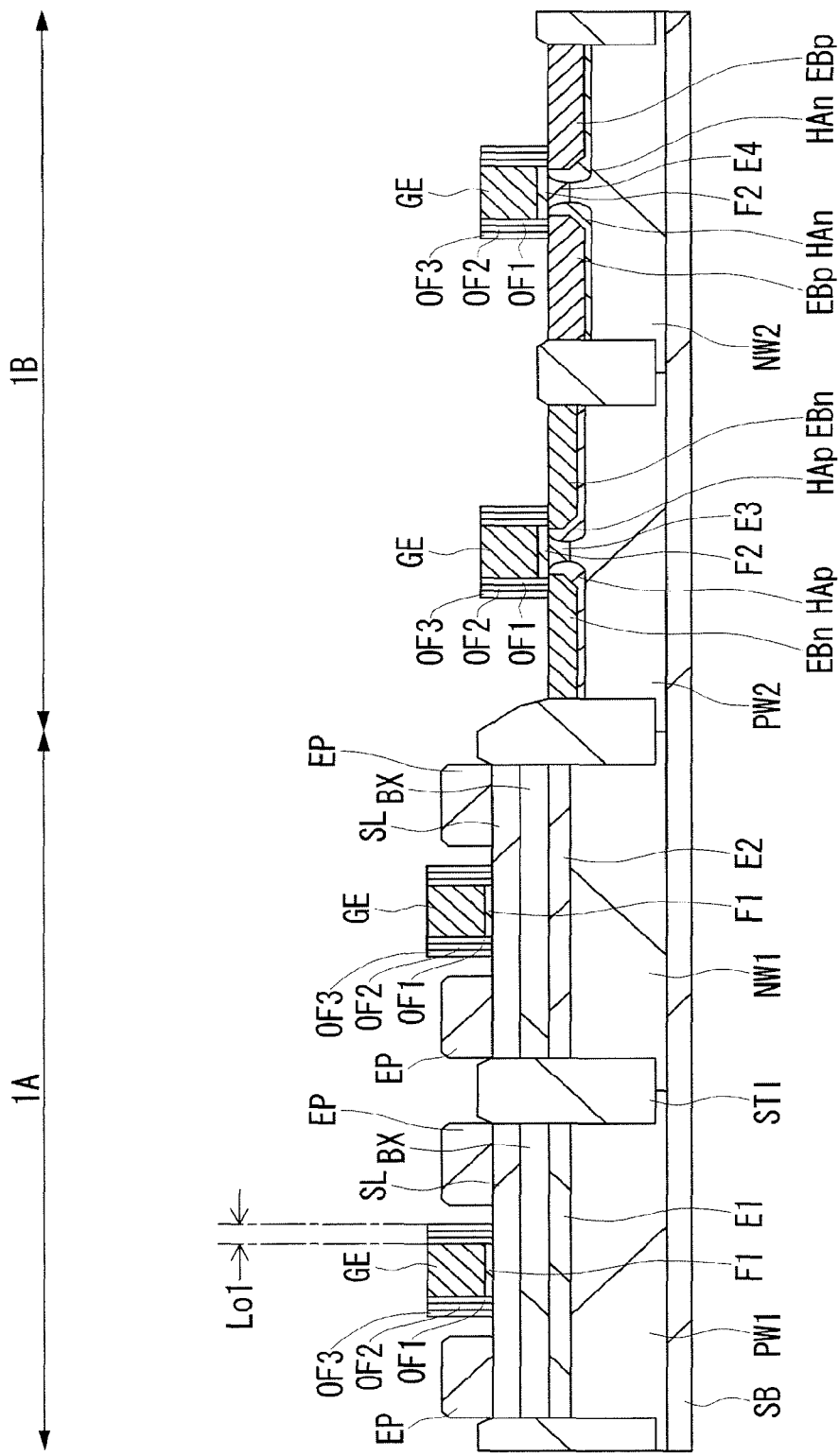
Figure 19:
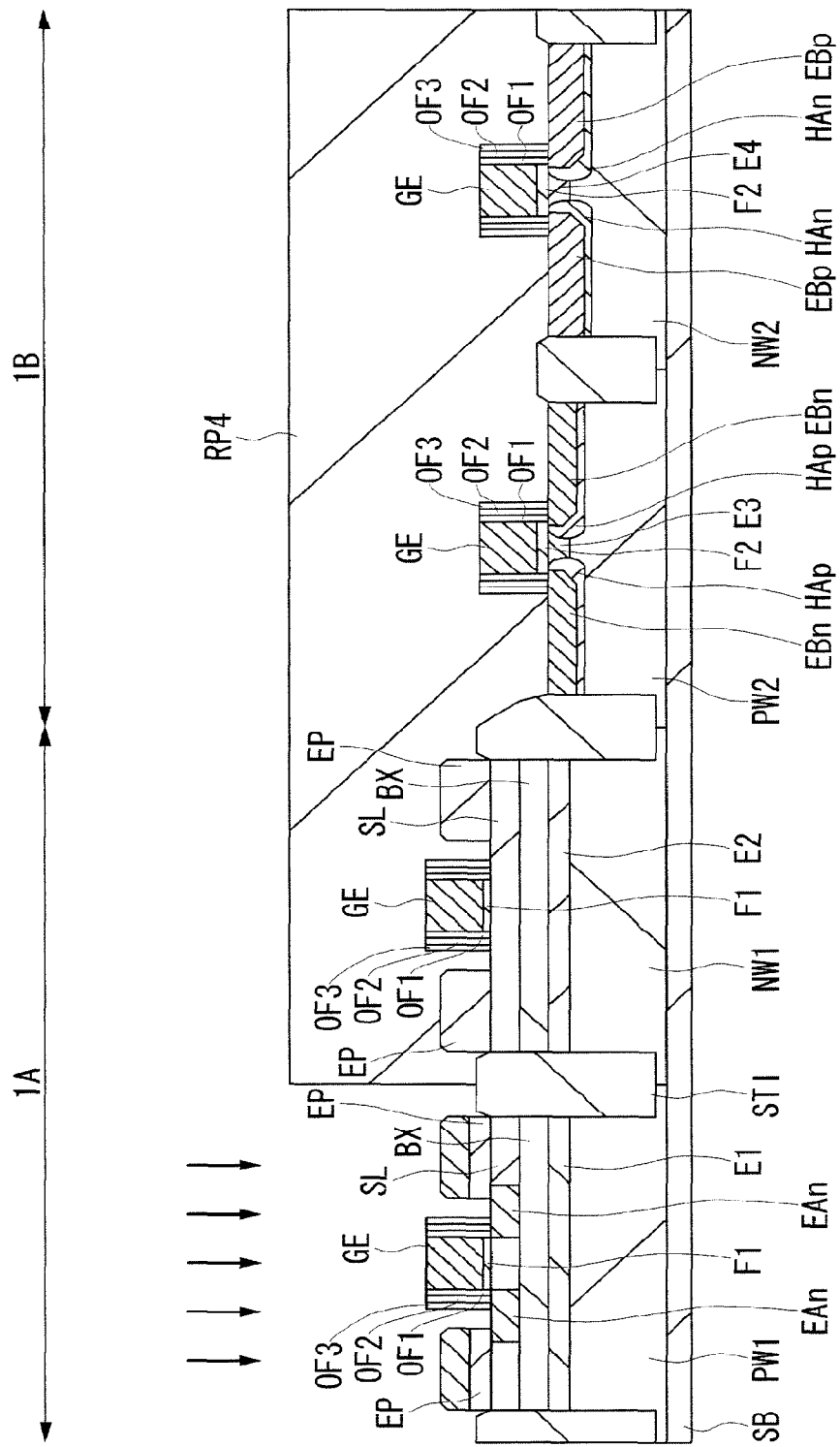
Figure 20:
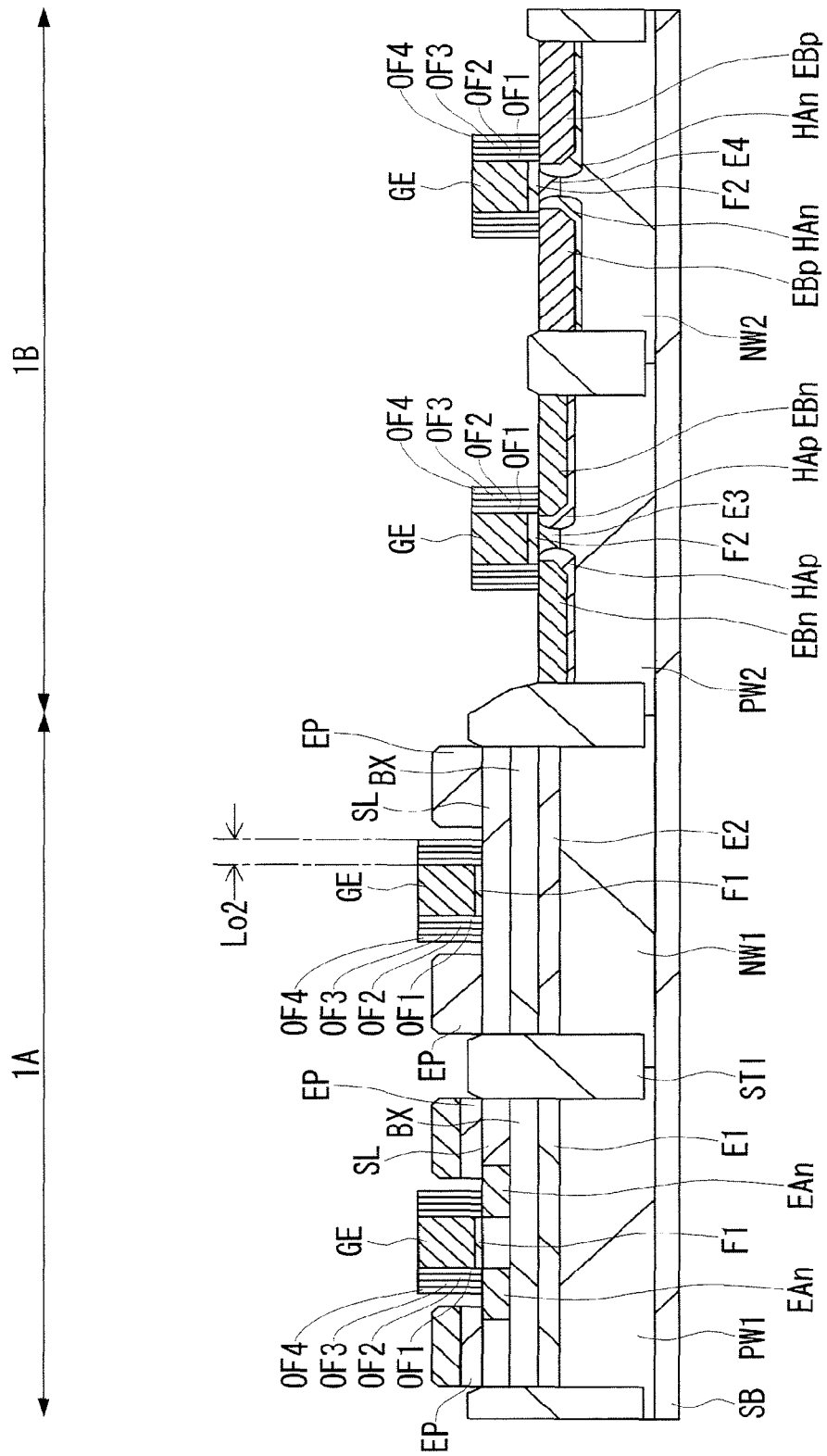
Figure 21:
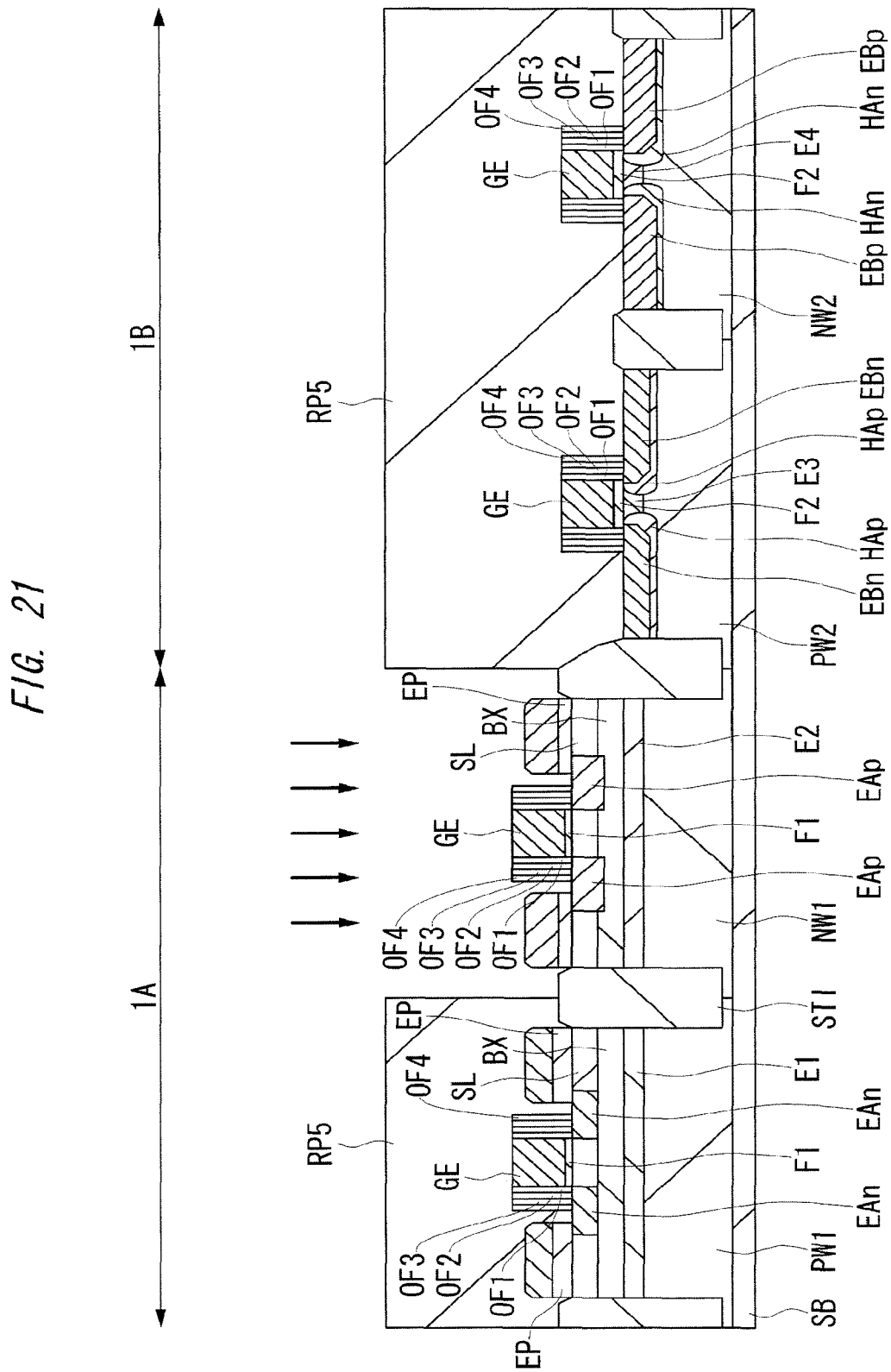
Figure 22:
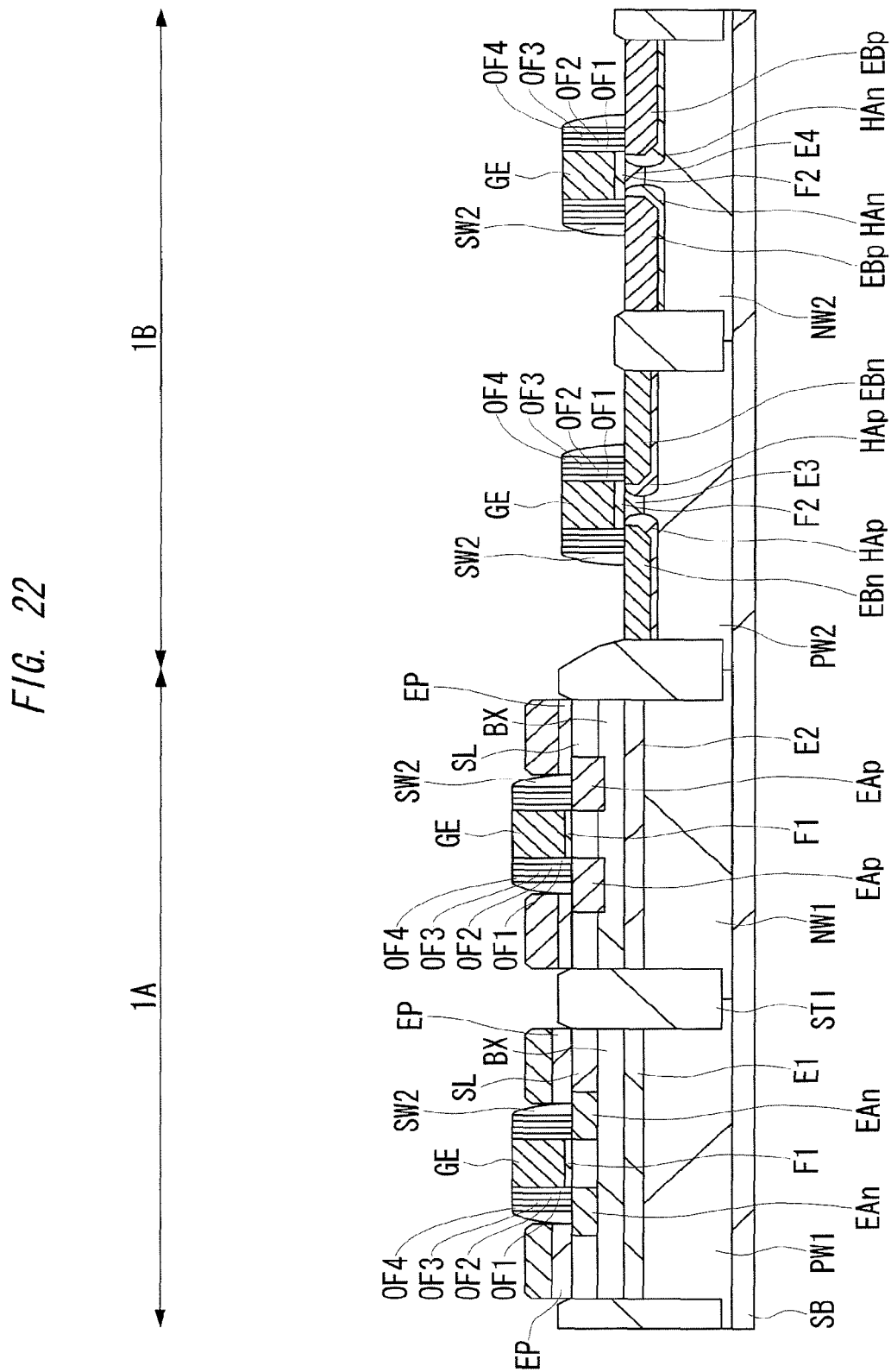
Figure 23:
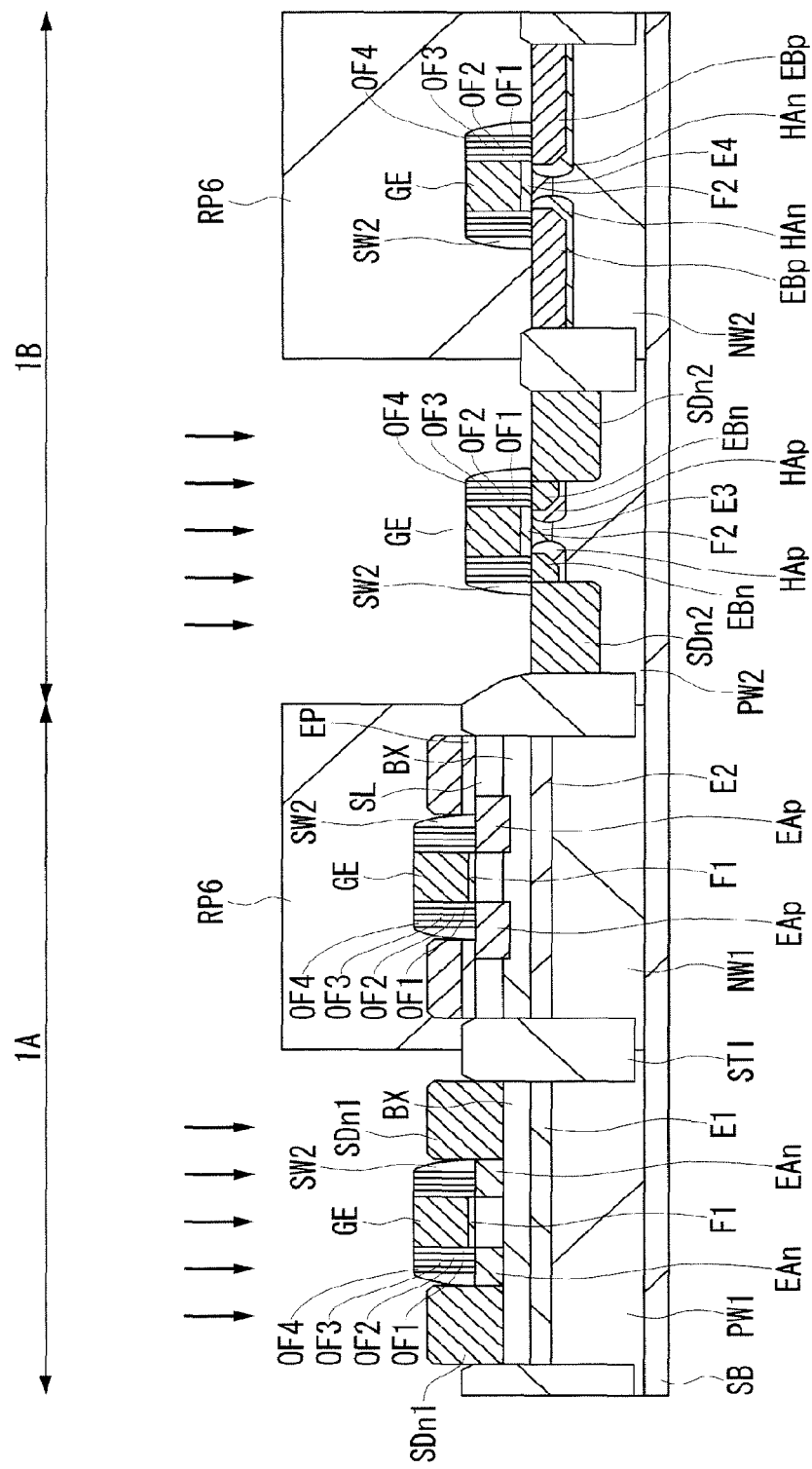
Figure 24:
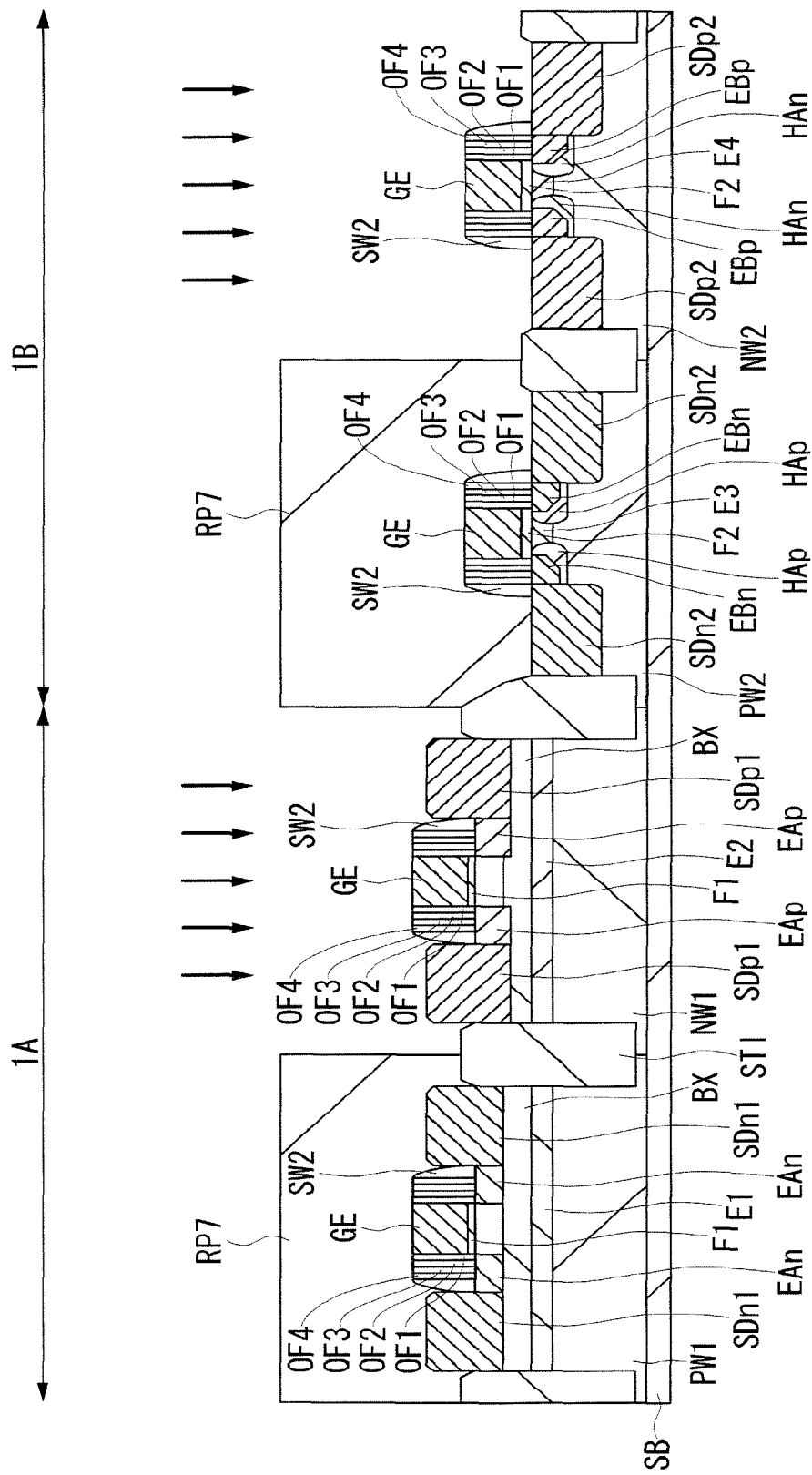
Figure 25:
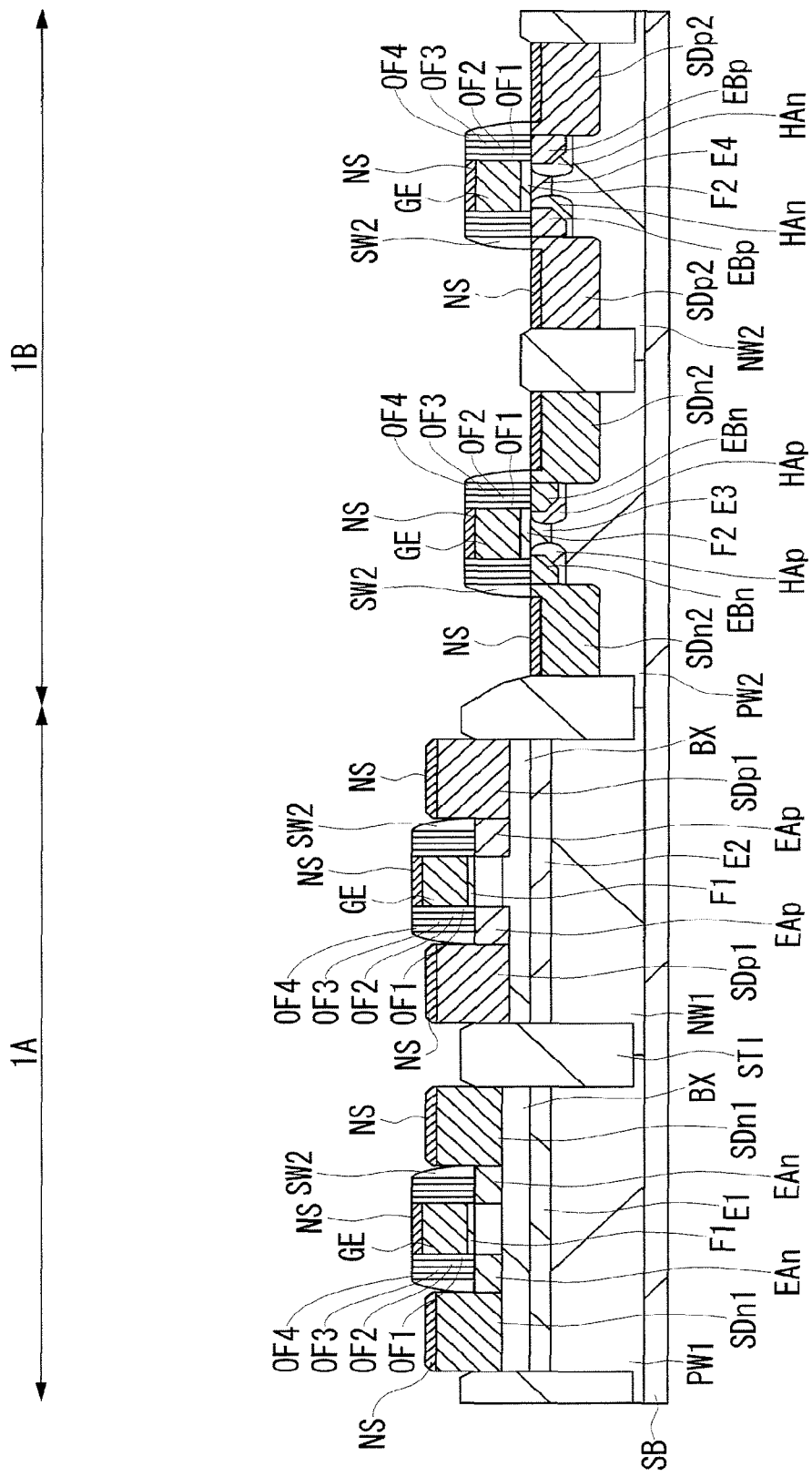
Figure 26:
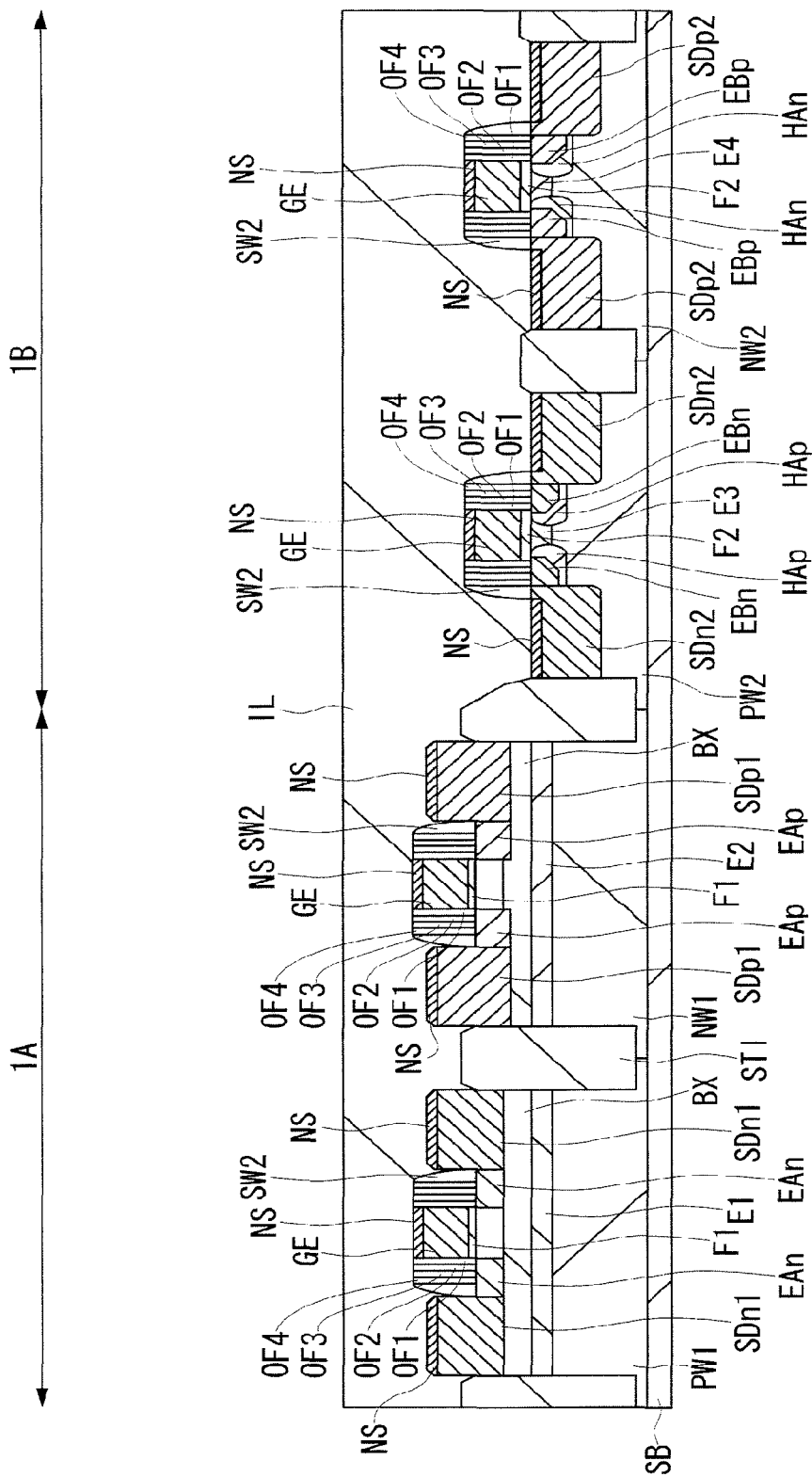
Figure 27:
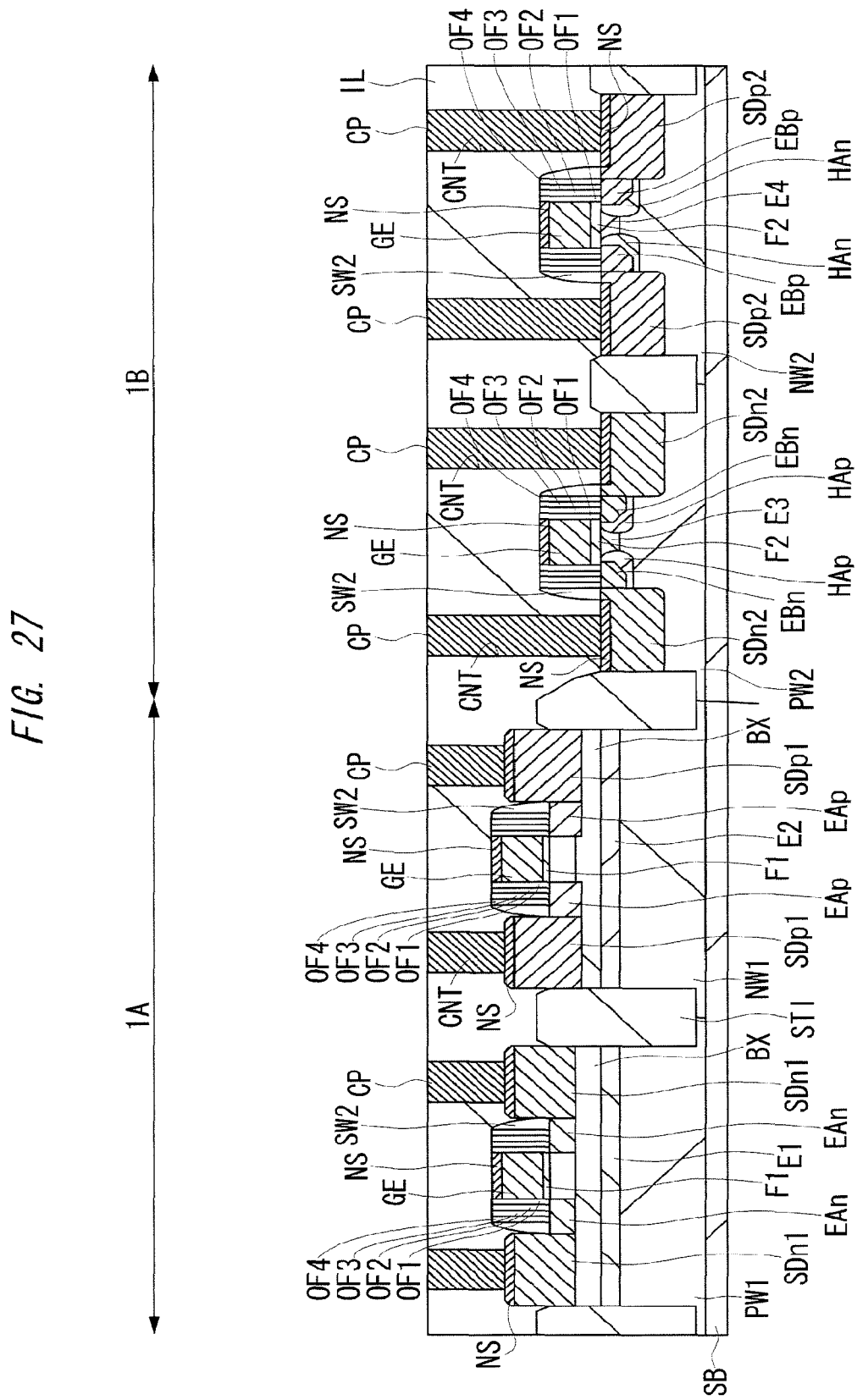

FIG. 3B a schematic cross-sectional view illustrating a configuration of the extension layer of the second fully-depleted SOI transistor according to the present embodiment, enlarging a part of a second fully-depleted p-channel SOI transistor;

FIG. 4A is a schematic cross-sectional view illustrating a configuration of an extension layer of a third fully-depleted SOI transistor according to the present embodiment, enlarging a part of a second fully-depleted n-channel SOI transistor;

FIG. 4B a schematic cross-sectional view illustrating a configuration of the extension layer of the third fully-depleted SOI transistor according to the present embodiment, enlarging a part of a second fully-depleted p-channel SOI transistor;

FIG. 5 is a cross-sectional view of main parts illustrating a manufacturing process of a semiconductor device according to the present embodiment;

FIG. 6 is a cross-sectional view of main parts illustrating the same portion as that of FIG. 5 during the manufacturing process of the semiconductor device continued from FIG. 5;

FIG. 7 is a cross-sectional view of main parts illustrating the same portion as that of FIG. 5 during the manufacturing process of the semiconductor device continued from FIG. 6;

FIG. 8 is a cross-sectional view of main parts illustrating the same portion as that of FIG. 5 during the manufacturing process of the semiconductor device continued from FIG. 7;

FIG. 9 is a cross-sectional view of main parts illustrating the same portion as that of FIG. 5 during the manufacturing process of the semiconductor device continued from FIG. 8;

FIG. 10 is a cross-sectional view of main parts illustrating the same portion as that of FIG. 5 during the manufacturing process of the semiconductor device continued from FIG. 9;

FIG. 11 is a cross-sectional view of main parts illustrating the same portion as that of FIG. 5 during the manufacturing process of the semiconductor device continued from FIG. 10;

FIG. 12 is a cross-sectional view of main parts illustrating the same portion as that of FIG. 5 during the manufacturing process of the semiconductor device continued from FIG. 11;

FIG. 13 is a cross-sectional view of main parts illustrating the same portion as that of FIG. 5 during the manufacturing process of the semiconductor device continued from FIG. 12;

FIG. 14 is a cross-sectional view of main parts illustrating the same portion as that of FIG. 5 during the manufacturing process of the semiconductor device continued from FIG. 13;

FIG. 15 is a cross-sectional view of main parts illustrating the same portion as that of FIG. 5 during the manufacturing process of the semiconductor device continued from FIG. 14;

FIG. 16 is a cross-sectional view of main parts illustrating the same portion as that of FIG. 5 during the manufacturing process of the semiconductor device continued from FIG. 15;

FIG. 17 is a cross-sectional view of main parts illustrating the same portion as that of FIG. 5 during the manufacturing process of the semiconductor device continued from FIG. 16;

FIG. 18 is a cross-sectional view of main parts illustrating the same portion as that of FIG. 5 during the manufacturing process of the semiconductor device continued from FIG. 17;

FIG. 19 is a cross-sectional view of main parts illustrating the same portion as that of FIG. 5 during the manufacturing process of the semiconductor device continued from FIG. 18;

FIG. 20 is a cross-sectional view of main parts illustrating the same portion as that of FIG. 5 during the manufacturing process of the semiconductor device continued from FIG. 19;

FIG. 21 is a cross-sectional view of main parts illustrating the same portion as that of FIG. 5 during the manufacturing process of the semiconductor device continued from FIG. 20;

FIG. 22 is a cross-sectional view of main parts illustrating the same portion as that of FIG. 5 during the manufacturing process of the semiconductor device continued from FIG. 21;

FIG. 23 is a cross-sectional view of main parts illustrating the same portion as that of FIG. 5 during the manufacturing process of the semiconductor device continued from FIG. 22;

FIG. 24 is a cross-sectional view of main parts illustrating the same portion as that of FIG. 5 during the manufacturing process of the semiconductor device continued from FIG. 23;

FIG. 25 is a cross-sectional view of main parts illustrating the same portion as that of FIG. 3 during the manufacturing process of the semiconductor device continued from FIG. 24;

FIG. 26 is a cross-sectional view of main parts illustrating the same portion as that of FIG. 5 during the manufacturing process of the semiconductor device continued from FIG. 25; and FIG. 27 is a cross-sectional view of main parts illustrating the same portion as that of FIG. 5 during the manufacturing process of the semiconductor device continued from FIG. 26.

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Further, it is needless to say that such phrases as "formed of A", "made of A", "having A" and "including A" do not eliminate other elements than A unless otherwise stated that the element is limited to that. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Moreover, in the following embodiments, a MISFET (Metal Insulator Semiconductor Field Effect Transistor) representing the field effect transistors will be abbreviated as "transistor". Also, in some drawings used in the embodiments, hatching is used even in a plan view so as to make the drawings easy to see. Note that components having the same function are denoted by the same reference symbols throughout the drawings for describing the embodiment, and the repetitive description thereof will be omitted. Hereinafter, embodiments of the present invention will be described in detail based on the accompanying drawings.

DETAILED DESCRIPTION OF PROBLEMS

Problems which are going to be solved in a fully-depleted SOI transistor discovered by the inventor of the present invention will be described because a semiconductor device according to the present embodiment will be considered to become clearer.

In the fully-depleted SOI transistor, when a source-drain enters deeply into a channel in association with fining, a phenomenon referred to as DIBL where an effective channel length becomes short, and a drain electric field affects the source, and an electric potential of a channel surface drops arises.

In addition, when overlapping (gate overlapping) between a source-drain and a gate electrode becomes large, a gate leakage current between the source and the gate electrode and between the drain and the gate electrode increases in the overlapped portion. In addition, when a voltage is applied to the gate electrode, the above-mentioned overlapped portion is depleted, and impact ionization arises, thereby increasing GIDL.

In addition, when overlapping capacitance between the source and the gate electrode and between the drain and the gate electrode increases in the above-mentioned overlapped portion, a switching speed of the fully-depleted SOI transistor drops, and thereby, a circuit operation speed of the semiconductor device will come to be deteriorated.

Embodiment

<Structure of First Fully-Depleted SOI Transistor>

Figure 1:
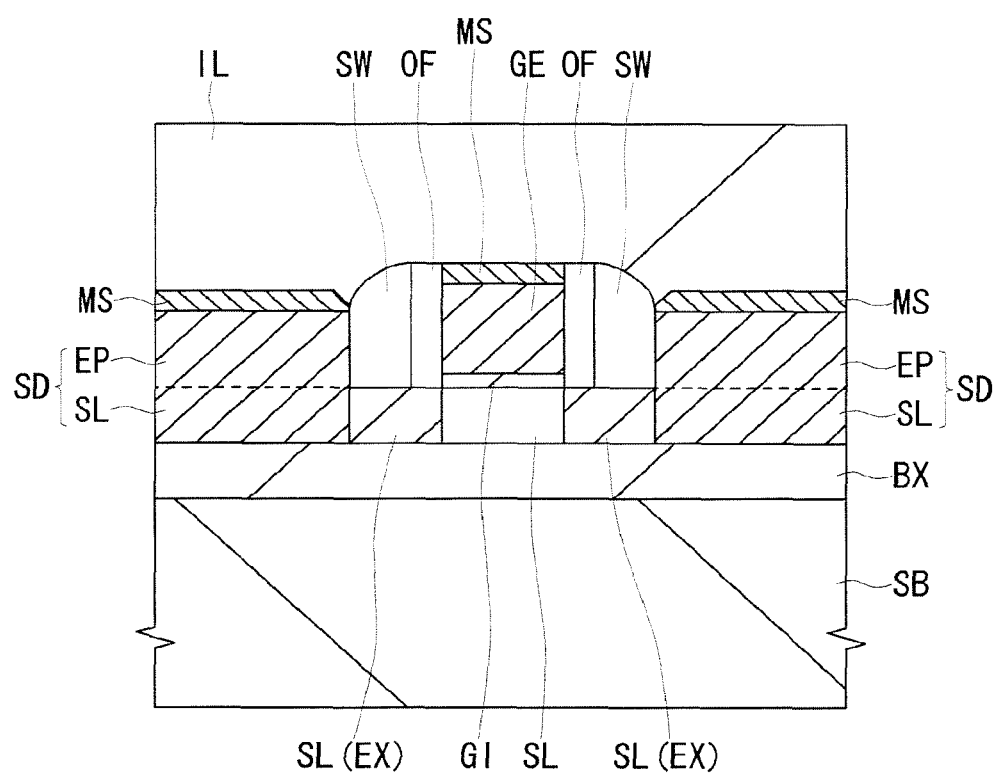
FIG. 1 is a cross-sectional view of main parts illustrating a structure of a first fully-depleted SOI transistor according to the present embodiment.

A structure of a first fully-depleted SOI transistor according to the present embodiment will be described with reference to FIG. 1. FIG. 1 is a cross-sectional view of main parts illustrating a structure of the first fully-depleted SOI transistor according to the present embodiment.

The fully-depleted SOI transistor has been formed on a main surface of an SOI substrate formed of a semiconductor substrate SB formed of single crystal silicon, an insulation film (embedded insulation film, embedded oxide film, BOX (Buried Oxide) film) BX formed of silicon oxide formed on the semiconductor substrate SB and a semiconductor layer (SOI layer, silicon layer) SL formed of single crystal silicon formed on the insulating layer BX. The semiconductor substrate SD is a supporting substrate which supports the insulating layer BX and a structure above the insulating layer BX. A thickness of the insulation film BX is, for example, about 10 to 20 nm, and a thickness of the semiconductor layer SL is, for example, about 10 to 20 nm.

On the semiconductor layer SL, a gate electrode GE is formed via a gate insulation film GI. The gate insulation film GI is formed of a silicon oxide film or a silicon oxynitride film, for example. A thickness of the gate insulation film GI is, for example, about 2 to 3 nm. As another aspect, a high permittivity gate insulation film (for example, metal oxide film such as a hafnium oxide film or an aluminum oxide film) whose permittivity is higher than a silicon nitride film can be used for the gate insulation film GI.

The gate electrode GE is formed of a conducting film, for example, a polycrystalline silicon film (polysilicon film, doped polysilicon film). As another aspect, a metal film or a metallic compound film which exhibits metallic conduction can also be used for the gate electrode GE.

The semiconductor layer SL under the gate electrode GE becomes a region in which a channel of the fully-depleted SOI transistor is formed. In addition, on the side walls of the gate electrode GE, a sidewall SW is formed via an offset spacer OF. The offset spacer OF and the sidewall SW are formed of an insulation film.

On a region which is not covered by the gate electrode GE, the offset spacer OF and the sidewall SW within the semiconductor layer SL, an epitaxial layer EP is formed selectively. Therefore, the epitaxial layer EP is formed on both sides (both sides in a gate length direction) of the gate electrode GE via the offset spacer OF and the sidewall SW.

In the semiconductor layer SL and the epitaxial layer EP on both sides (both sides in the gate length direction) of the gate electrode GE, a semiconductor region for a source-drain of the fully-depleted SOI transistor is formed, and the semiconductor region for the source-drain is formed of an extension layer EX and a diffusion layer SD whose impurity concentration is higher than the extension layer EX.

That is, in the semiconductor layer SL under the offset spacer OF and the sidewall SW, a pair of extension layers EX are formed in the regions which are separated from each other on both sides of the channel, and on the outside (side departing from the channel) of the extension layer EX in a laminating section between the semiconductor layer SL and the epitaxial layer EP, a pair of diffusion layers SD are formed.

The extension layer EX adjoins the channel, and the diffusion layer SD is separated by the width of the extension layer EX from the channel and is formed in a position in contact with the extension layer EX.

In the upper part (layer part) of the diffusion layer SD, a metal silicide layer MS which is a reaction layer (compound layer) between a metal and the diffusion layer SD is formed. The metal silicide layer MS is a cobalt silicide layer, a nickel silicide layer, or a nickel platinum silicide layer etc., for example. In addition, when the gate electrode GE is formed of a polycrystalline silicon film, the metal silicide layer MS is formed also in the upper part of the gate electrode GE.

On the main surface of the SOI substrate, an interlayer insulation film IL is formed so as to cover the gate electrode GE, the offset spacer OF, the sidewall SW and the metal silicide layer MS etc. A contact hole is formed in the interlayer insulation film IL, and a contact plug is formed in the inside of this contact hole, and however, the illustrations are omitted here. In addition, although wirings are formed on the interlayer insulation film IL, the illustration is omitted here.

Figure 2A:
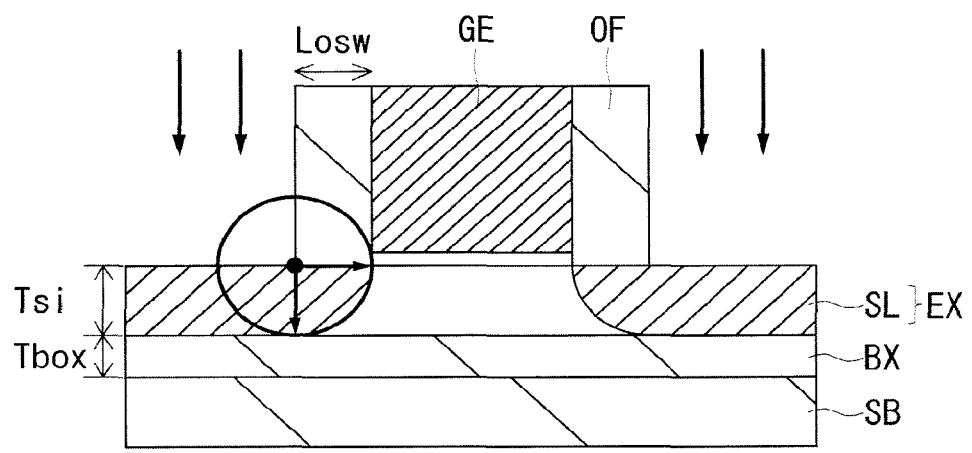
FIG. 2A is a schematic cross-sectional view illustrating a configuration of an extension layer of the first fully-depleted SOI transistor according to the present embodiment, enlarging a part of the first fully-depleted SOI transistor which has an offset spacer having the minimum width.
Figure 2B:
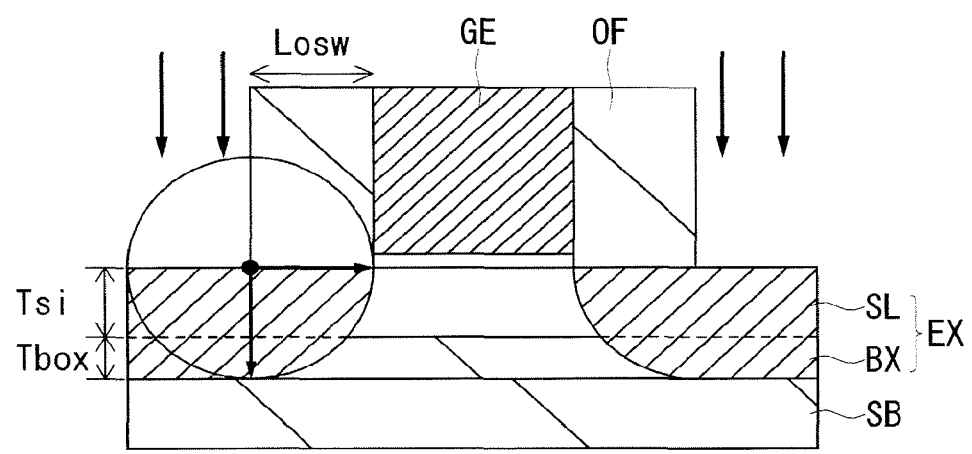
FIG. 2B is a schematic cross-sectional view illustrating a configuration of the extension layer of the first fully-depleted SOI transistor according to the present embodiment, enlarging a part of the first fully-depleted SOI transistor which has an offset spacer having the maximum width.

Next, a configuration of the extension layer of the first fully-depleted SOI transistor according to the present embodiment will be described using the above-mentioned FIG. 1 and FIGS. 2A and 2B. FIG. 2A is a schematic cross-sectional view illustrating with enlarging a part of the first fully-depleted SOI transistor that has an offset spacer of the minimum width. FIG. 23 is a schematic cross-sectional view illustrating with enlarging a part of the first fully-depleted SOI transistor that has an offset spacer of the maximum width.

As illustrated in the above-mentioned FIG. 1, on the side walls of the gate electrode GE of the fully-depleted SOI transistor, the offset spacer OF is formed, and in the regions which are separated from each other in the semiconductor layer SL under this offset spacer OF, a pair of extension layers EX for the source-drain are formed.

However, as mentioned above, in the fully-depleted SOI transistor, when the extension layer EX enters into the channel under the gate electrode GE, overlapping (gate overlapping) between the gate electrode GE and the extension layer EX becomes large, and thereby, deterioration of a switching speed, etc. due to a short channel effect, an increase of a leakage current (gate leakage current and GIDL) and an increase of a parasitic capacitance is concerned about. Then, in the present embodiment, these problems are solved by optimizing overlapping (gate overlapping) between the gate electrode GE and the extension layer EX. Hereinafter, measures for solving these problems will be described in detail.

The extension layer EX is formed by ion-implanting an impurity into the semiconductor layer SL after the offset spacer OF is formed on the side walls of the gate electrode GE. Then, by configuring a width of the offset spacer OF so as to fulfill the following condition (1), condition (2) and condition (3), an impurity is made to be kept from entering to the channel from a position lower than the end part of the gate electrode GE when the impurity is ion-implanted into the semiconductor layer SL.

Condition (1): that the extension layer EX is distributed ranging from the upper surface of the semiconductor layer SL to the lower surface (interface between the semiconductor layer SL and the insulation film BX).

Condition (2): that the extension layer EX is distributed up to the semiconductor layer SL at a position lower than the end part of the gate electrode GE.

Condition (3): that the extension layer EX is not distributed in the semiconductor substrate SB over the insulation film BX.

As illustrated in FIG. 2A, from the condition (1) and the condition (2), the minimum width of the offset spacer OF is determined by a thickness Tsi of the semiconductor layer SL. In addition, as illustrated in FIG. 2B, from the condition (3), the maximum width of the offset spacer OF is determined by a thickness of the sum total of a thickness Tsi of the semiconductor layer SL and a thickness Tbox of the insulation film BX. Therefore, a width Losw of the offset spacer OF is configured so that the following formula may be satisfied:

$$Tsi \leq Losw \leq Tsi+Tbox.$$

For example, when a thickness of the semiconductor layer SL is 12 nm, and a thickness of the insulation film BX is 10 nm, a width Losw of the extension layer EX may be configured in a range of 12 to 22 nm.

Thereby, in the fully-depleted SOI transistor, reduction of a short channel effect, reduction of a leakage current (gate leakage current and GIDL) and reduction of a parasitic capacitance can be achieved because overlapping (gate overlapping) between the gate electrode GE and the extension layer EX can be suppressed. Therefore, reliability and performance of the semiconductor device which has the fully-depleted SOI transistor can be enhanced.

<Structure of Second Fully-Depleted SOI Transistor>

A configuration of an extension layer of a second fully-depleted SOI transistor according to the present embodiment will be described with reference to FIGS. 3A and 3E. FIG. 3A is a schematic cross-sectional view illustrating with enlarging apart of a second fully-depleted n-channel SOI transistor. FIG. 3B is a schematic cross-sectional view illustrating with enlarging a part of a second fully-depleted p-channel SOI transistor.

In the fully-depleted n-channel SOI transistor, an n-type extension layer is formed while an n-type impurity, for example, As (arsenic) or P (phosphorus), is ion-implanted into a semiconductor layer, and in the fully-depleted p-channel SOI transistor, a p-type extension layer is formed while an p-type impurity, for example, B (boron) or $BF_2$ (boron fluoride), is ion-implanted into a semiconductor layer.

However, a diffusion factor in Si (silicon) with respect to these impurities is different from each other, and a diffusion factor of B (boron) is larger than a diffusion factor of As (arsenic), for example. Therefore, when B (boron) and As (arsenic) are ion-implanted into the semiconductor layer while a width of the offset spacer is assumed to be the same, B (boron) has a possibility of entering in the channel even if As (arsenic) is made not to enter into the channel while distributed up to a position lower than the end part of the gate electrode. In addition, when B (boron) is made not to enter in the channel while being distributed up to a position lower than the end part of the gate electrode, there is a possibility that As (arsenic) may not be distributed up to a position lower than the end part of the gate electrode.

Then, when the fully-depleted n-channel SOI transistor and the fully-depleted p-channel SOI transistor are formed in the same SOI substrate, an n-type impurity or a p-type impurity is ion-implanted while offset spacers having a width different from each other on the side walls of each gate electrode are formed.

As illustrated in FIG. 3A, in the fully-depleted n-channel SOI transistor, an n-type impurity, e.g., As (arsenic), is ion-implanted into the semiconductor layer SL after an offset spacer OFa of one layer is formed on the side walls of the gate electrode GE. A width Losw1 of the offset spacer OFa is configured so that the following formula may be satisfied:

$$Tsi \leq Losw1 \leq Tsi+Tbox.$$

In addition, as illustrated in FIG. 3B, in the fully-depleted p-channel SOI transistor, a P-type impurity, for example, B (boron), is ion-implanted into the semiconductor layer SL after offset spacers of two or more layers, for example, two layers OFa and OFb, are formed on the side walls of the gate electrode GE. A width Losw2 of the offset spacers OFa and OFb is configured so that the following formulas may be satisfied:

$$Tsi \leq Losw2 \leq Tsi+Tbox,$$

$$Losw1 < Losw2.$$

That is, a width of the offset spacer formed on the side walls of the gate electrode GE of the fully-depleted n-channel SOI transistor and a width of the offset spacer formed on the side walls of the gate electrode GE of the fully-depleted p-channel SOI transistor are used differently. Thus, in the fully-depleted n-channel SOI transistor and the fully-depleted p-channel SOI transistor, overlapping (gate overlapping) between the gate electrode GE and the extension layer EX can be each optimized.

<Structure of Third Fully-Depleted SOI Transistor>

A structure of an extension layer of a third fully-depleted SOI transistor according to the present embodiment will be described with reference to FIGS. 4A and 4B. FIG. 4A is a schematic cross-sectional view illustrating with enlarging a part of a third fully-depleted n-channel SOI transistor. FIG. 4B is a schematic cross-sectional view illustrating with enlarging a part of a third fully-depleted p-channel SOI transistor.

In a semiconductor device, a fully-depleted SOI transistor and a bulk transistor may be formed on the same semiconductor substrate. In this case, in order to optimize each operational characteristic, the extension layer of the fully-depleted SOI transistor and the extension layer of the bulk transistor are manufactured by a mutually different manufacturing process. Therefore, offset spacers formed on the side walls of the gate electrode of the bulk transistor when the extension layer of the bulk transistor is formed may be formed on the side walls of the gate electrode of the fully-depleted SOI transistor.

Then, when the fully-depleted SOI transistor and the bulk transistor are formed on the same semiconductor substrate, it is necessary to configure a width of the offset spacer formed on the side walls of the gate electrode of the fully-depleted SOI transistor while a width of the offset spacer formed on the side walls of the gate electrode of the bulk transistor is also taken into consideration.

AS illustrated in FIG. 4A, in the fully-depleted n-channel SOI transistor, an n-type impurity, for example, As (arsenic), is ion-implanted after the offset spacers OFc and OFd for the bulk transistor and the offset spacer OFa for the fully-depleted n-channel SOI transistor are formed on the side walls of the gate electrode GE. A width Losw3 of the offset spacers OFa, OFc and OFd is configured so that the following formula may be satisfied:

$$Tsi \leq Losw3 \leq Tsi+Tbox.$$

In addition, as illustrated in FIG. 4B, in the fully-depleted p-channel SOI transistor, after the offset spacers OFc and OFd for the bulk transistor and the offset spacers OFa and OFb for the fully-depleted p-channel SOI transistor are formed on the side walls of the gate electrode GE, a p-type impurity, for example, B (boron), is ion-implanted. A width Losw4 of the offset spacers OFa, OFb, OFc and OFd is configured so that the following formulas may be satisfied:

$$Tsi \leq Losw4 \leq Tsi+Tbox,$$

$$Losw3 < Losw4.$$

That is, when the offset spacer for the bulk transistor is formed on the side walls of the gate electrode GE of the fully-depleted SOI transistor, a width of the offset spacer for the fully-depleted SOI transistor is configured while a width of the offset spacer for the bulk transistor is taken into consideration. Thus, even when the offset spacer for the bulk transistor is formed on the side walls of the gate electrode GE of the fully-depleted SOI transistor, overlapping (gate overlapping) between the gate electrode GE and the extension layer EX can be optimized.

Note that, although the offset spacers of three layers OFa OFc and OFd are formed on the side walls of the gate electrode GE in the above-mentioned fully-depleted n-channel SOI transistor, and the offset spacers of four layers OFa, OFb, OFc and OFd are formed on the side walls of the gate electrode GE in the above-mentioned fully-depleted p-channel SOI transistor, the number of layers of the offset spacer is not limited to this.

<Manufacturing Method of Semiconductor Device>

An example of a manufacturing method of the semiconductor device according to the present embodiment (fully-depleted SOI transistor and bulk transistor) will be described in order of processes with reference to FIGS. 5 to 27. FIGS. 5 to 27 are cross-sectional views of main parts in a manufacturing process of the semiconductor device according to the present embodiment. Here, a manufacturing method of the third fully-depleted SOI transistor described using the FIG. 4A and FIG. 4B will be exemplified.

In the present embodiment, a region in which an SOI transistor (n-channel SOI transistor or p-channel SOI transistor) is formed is referred to as an SOI region 1A, and a region in which a bulk transistor (n-channel bulk or p-channel bulk transistor) is formed is referred to as a bulk region 1B. In the SOI region 1A, an SOI transistor is formed on a main surface of an SOI substrate formed of a semiconductor substrate, an insulation film on the semiconductor substrate and a semiconductor layer on an insulation film, and in the bulk region 1B, a bulk transistor is formed on a main surface of the semiconductor substrate. In the following descriptions, the SOI region 1A will be illustrated on the left-hand side of the figures, and the bulk region 1B will be illustrated on the right-hand side of the figures.

As illustrated in FIG. 5, the semiconductor substrate SB on which the insulation film BX and the semiconductor layer SL are laminated is prepared. The semiconductor substrate SB is a supporting substrate formed of single crystal Si (silicon), and the insulation film BX on the semiconductor substrate SB is formed of silicon oxide, and the semiconductor layer SL on the insulation film BX is formed of single crystal silicon which has a resistance of about 1 to 10 Ωcm. A thickness of the insulation film BX is, for example, about 10 to 20 nm, and a thickness of the semiconductor layer SL is, for example, about 10 to 20 nm.

The SOI substrate can be formed by, for example, a SIMOX (Silicon Implanted Oxide) method or a laminating method. In the SIMOX method, $O_2$ (oxygen) is ion-implanted with a high energy into the main surface of the semiconductor substrate formed of Si (silicon), and Si (silicon) and $O_2$ (oxygen) are made to be combined by a subsequent heat treatment, and an embedded oxide film (BOX film) is formed in a position slightly deeper than the surface of the semiconductor substrate, and thereby, the SOI substrate is formed. In addition, in the laminating method, the semiconductor substrate formed of Si (silicon) with an oxide film (BOX film) formed on a surface thereof and another semiconductor substrate formed of Si (silicon) are made to be adhered and laminated by applying high heat and pressure, and thereafter, the semiconductor substrate of one side is polished and made into a thin film, and thereby, the SOI substrate is formed.

Next, as illustrated in FIG. 6, a device isolation section STI formed of an insulation film which has an STI (Shallow Trench Isolation) structure is formed on the semiconductor substrate SB.

In a process of forming the device isolation section STI, first, a hard mask pattern formed of silicon nitride is formed on the semiconductor layer SL, and dry etching is performed by using this hard mask pattern as a mask, and thereby, two or more grooves reaching a midway depth of the semiconductor layer SL from the upper surface of the semiconductor substrate SB are formed. Two or more grooves are formed with the semiconductor layer SL, the insulation film BX and the semiconductor substrate SB opened. Subsequently, after a liner oxide film is formed in the inside of the two or more grooves, an insulation film formed of, for example, silicon oxide is formed by, for example, a CVD (Chemical Vapor Deposition) method on the semiconductor layer SL including the inside of the two or more grooves. Subsequently, the upper surface of this insulation film is polished by, for example, a CMP (Chemical Mechanical Polishing) method, and the insulation film is made to remain in the inside of the two or more grooves. Subsequently, the hard mask pattern is removed. Thus, the device isolation section STI is formed.

The device isolation section STI is an inactive region which separates two or more active regions mutually on the semiconductor substrate SB. That is, a shape in a plan view of the active region is defined by being surrounded by the device isolation section STI. In addition, two or more device isolation sections STI are formed so that the SOI region 1A and the bulk regions 1B may be separated, and in each of the SOI region 1A and the bulk region 1B, two or more device isolation sections STI are formed so that adjacent element formation regions may be separated.

Next, as illustrated in FIG. 7, an insulation film OX formed of, for example, silicon oxide is formed on the upper surface of the semiconductor layer SL by, for example, a thermal oxidation method. Note that, the insulation film OX may be formed by a part of the hard mask pattern formed of the silicon nitride mentioned above being made to remain.

Subsequently, by ion-implanting an impurity via the insulation film OX, the semiconductor layer SL and the insulation film BX in the SOI region 1A in which the n-channel SOI transistor is formed, a p-type well PW1 and a threshold voltage control diffusion region E1 are selectively formed in a desired region of the semiconductor substrate SB. In the same way, by ion-implanting an impurity via the insulation film OX, the semiconductor layer SL and the insulation film BX in the SOI region 1A in which the p-channel SOI transistor is formed, an n-type well NW1 and a threshold voltage control diffusion region E2 are selectively formed in a desired region of the semiconductor substrate SB.

Subsequently, by ion-implanting an impurity via the insulation film OX, the semiconductor layer SL and the insulation film BX in the bulk region 1B in which the n-channel bulk transistor is formed, a p-type well PW2 and a threshold voltage control diffusion region E3 are selectively formed in a desired region of the semiconductor substrate SB. In the same way, by ion-implanting an impurity via the insulation film OX, the semiconductor layer SL and the insulation film BX in the bulk region 1B in which the p-channel bulk transistor is formed, an n-type well NW2 and a threshold voltage control diffusion region E4 are selectively formed in a desired region of the semiconductor substrate SB.

Next, as illustrated in FIG. 8, a photoresist pattern RP1 is formed in the SOI region 1A by, for example, a lithography technology. Specifically, the photoresist film is applied on the SDI substrate, and the photoresist pattern RP1 to open the bulk region 1B is formed. At this time, the photoresist pattern RP1 is formed so that the device isolation section STI of the boundary of between the SOI region 1A and the bulk region 1B may be covered.

Next, as illustrated in FIG. 9, the insulation film OX of the bulk region 1B is removed by, for example, hydrofluoric acid cleaning. At this time, since a part of the upper part of the device isolation section STI of the bulk region 1B is cut away, it is possible to adjust a level difference between the semiconductor substrate SB and the device isolation section STI in the bulk region 1B, and it is possible to make smooth a level difference on the STI generated at the boundary section of the photoresist pattern RP1.

Subsequently, the photoresist pattern RP1 is removed after the semiconductor layer SL of the bulk region 1B is removed selectively with the insulation film BX as a stopper by, for example, dry etching method. Subsequently, after the insulation film BX of the bulk region 1B is removed by, for example, the hydrofluoric acid cleaning, if necessary, a sacrifice oxidation method in which a thermally-oxidized film of, for example, about 10 nm is formed on the surface of the semiconductor substrate SB by, for example, the thermal oxidation method, and the formed thermally-oxidized film is removed may be used. Thus, a damaged layer introduced into the semiconductor substrate SB by the dry etching by which the semiconductor layer SL has been removed can be removed.

In the SOI region 1A and the bulk region 1B which are formed through the above processes, a level difference between the semiconductor layer SL surface of the SOI region 1A and the surface of the semiconductor substrate SB of the bulk region 1B is as small as about 20 nm. This enables the SOI transistor and the bulk transistor to be formed in the same process in depositing and processing of the polycrystalline silicon film which is to be a gate electrode in the following, and becomes effective with respect to prevention etc. of residues in the level difference processing, or breaking of wires of the gate electrode.

Next, as illustrated in FIG. 10, a gate insulation film F1 of the SOI transistor is formed in the SOI region 1A, and a gate insulation film F2 of the bulk transistor is formed in the bulk region 1B. A thickness of the gate insulation film F1 is, for example, about 2-3 nm, and a thickness of the gate insulation film F2 is, for example, about 7-8 nm. Subsequently, a polycrystalline silicon film G1 and a silicon nitride film D1 are laminated in order on the gate insulation film F1 and F2 by, for example, a CVD method. A thickness of the polycrystalline silicon film G1 is, for example, about 40 nm, and a thickness of the silicon nitride film D1 is, for example, about 30 nm. Note that, in cross-sectional views used in the present embodiment, a large and small relation of each film thickness of each film is not illustrated accurately for making figures understood easily.

The gate insulation film F1 of the SOI transistor and the gate insulation film F2 of the bulk transistor are formed as follows specifically. First, the insulation film EX exposed on the surface of the bulk region 1B is removed by the hydrofluoric acid cleaning, for example, and the surface of the semiconductor substrate SB of the bulk region 1B is made to be exposed. Subsequently, a thermally-oxidized film of, for example, about 7.5 nm thick is formed on the semiconductor substrate SB of the bulk region 1B by, for example, the thermal oxidation method.

At this time, also in the SOI region 1A, the insulation film OX which has been exposed on the surface is removed in the same way, and the thermally-oxidized film of, for example, about 7.5 nm thick is formed on the semiconductor layer SL. After this is removed by, for example, the lithography technology and the hydrofluoric acid cleaning selectively, cleaning is performed for removing etching residues and an etching solution, etc. Subsequently, a thermally-oxidized film of, for example, about 2 nm thick is formed on the semiconductor layer SL of the SOI region 1A by, for example, the thermal oxidation method.

By nitriding with a NO gas the surface of these thermally-oxidized film of about 7.5 nm thick and thermally-oxidized film of about 2 nm thick, a nitride film of about 0.2 nm is formed in a laminated manner on the main surface, and an insulation film (nitride film/thermally-oxidized film) formed on the semiconductor layer SL of the SOI region 1A is assumed to be a gate insulation film F1, and an insulation film (nitride film/thermally-oxidized film) formed on the semiconductor substrate SB of the bulk region 1B is assumed to be a gate insulation film F2.

In this way, the gate insulation film F2 of the bulk transistor can be formed more thickly than the gate insulation film F1 of the SOI transistor. Thus, a withstand voltage of the bulk transistor can be made high, and high voltage operation becomes possible.

Next, as illustrated in FIG. 11, the silicon nitride film D1 and the polycrystalline silicon film G1 are processed by, for example a lithography technology and an anisotropic dry etching method, and a gate protection film GD formed of the silicon nitride film D1 and a gate electrode GE formed of the polycrystalline silicon film G1 in the SOI transistor are formed on the SOI region 1A. At the same time, a gate protection film GD formed of the silicon nitride film D1 and a gate electrode GE formed of the polycrystalline silicon film G1 in the bulk transistor are formed in the bulk region 1D. In the present embodiment, as mentioned above, a level difference between the semiconductor layer SL surface of the SOI region 1A and the surface of the semiconductor substrate SB of the bulk region 1B is as low as about 20 nm, and therefore, is in a tolerance of a depth of focus at the time of lithography, and the gate protection film GD and the gate electrode GE of the SOI transistor and the gate protection film GD and the gate electrode GE of the bulk transistor can be formed concurrently.

Next, as illustrated in FIG. 12, this silicon nitride film is selectively processed by, for example, the anisotropic dry etching method after a silicon nitride film of, for example, about 10 nm thick is deposited by, for example, the CVD method. Thus, an offset spacer OF1 formed of silicon nitride is formed on the side walls of the gate electrode GE and gate protection film GD of the SOI transistor, and on the side walls of the gate electrode GE and gate protection film DID of the bulk transistor.

Next, as illustrated in FIG. 13, a photoresist pattern RP2 is formed by, for example, the lithography technology on the SOI region 1A and the region in which the p-channel bulk transistor is formed in the bulk region 1B. Subsequently, a p-type impurity, for example, a $BF_2$ (boron fluoride) ion, is ion-implanted in the region in which the n-channel bulk transistor is formed in the bulk region 1B with the photoresist pattern RP2 as a mask, and subsequently, an n-type impurity, for example, an As (arsenic) ion, is ion-implanted. Thus, an n-type extension layer EBn of the n-channel bulk transistor and a p-type halo region HAp in the channel side of the n-type extension layer EBn are formed in a self-alignment manner. In the n-channel bulk transistor, it is possible to suppress the n-type extension layer EBn from diffusing in a channel direction by providing p-type halo region HAp.

Subsequently, the photoresist pattern RP2 is removed.

Next, as illustrated in FIG. 14, after a silicon oxide film of, for example, about 10 nm thick is deposited by, for example, the CVD method, this silicon oxide film is processed selectively by, for example, the anisotropic dry etching method. Thus, on the side walls of the gate electrode GE and gate protection film GD of the SOI transistor, and on the side walls of the gate electrode GE and gate protection film GD of the bulk transistor, an offset spacer OF2 formed of silicon oxide is formed via an offset spacer OF1.

Next, a photoresist pattern RP3 is formed by, for example, the lithography technology on the SOI region 1A and the region in which the n-channel bulk transistor is formed in the bulk region 1B. Subsequently, an n-type impurity, for example an As (arsenic) ion, is ion-implanted in the region in which the p-channel bulk transistor is formed in the bulk region 1B with the photoresist pattern RP3 as a mask, and subsequently, a p-type impurity, for example, a BF2 (boron fluoride) ion, is ion-implanted. Thus, a p-type extension layer EBp of the p-channel bulk transistor and an n-type halo region HAn in the channel side of the p-type extension layer EBp are formed in a self-alignment manner. In the p-channel bulk transistor, it is possible to suppress the p-type extension layer EBp from diffusing in a channel direction by providing the n-type halo region HAn.

Subsequently, the photoresist pattern RP3 is removed.

Next, as illustrated in FIG. 15, after a silicon nitride film of, for example, about 40 nm thick is deposited by, for example, the CVD method, this silicon nitride film is processed selectively by, for example, the anisotropic dry etching method. Thus, on the side walls of the gate electrode GE and gate protection film GD of the SDI transistor, and on the side walls of the gate electrode GE and gate protection film GD of the bulk transistor, a sidewall SWT formed of silicon nitride is formed via the offset spacers OF1 and OF2. Subsequently, the sidewall SW1 of the bulk transistor is removed, and the offset spacers OF1 and OF2 and the sidewall SW1 are made to remain on the side walls of the gate electrode GE and gate protection film GD of the SOI transistor.

Next, as illustrated in FIG. 16, after the bulk region 1B is covered by a protection film FIB, a stacked single crystal layer formed of Si (silicon) or SiGe (silicon germanium), i.e. the epitaxial layer EP, is formed selectively on the semiconductor layer SL in the exposed SOI region 1A by, for example, a selective epitaxial growth method. Subsequently, the protection film PB is removed.

The epitaxial layer EP is formed by performing an epitaxial growth process while, for example, batch type vertical-type epitaxial growth apparatus is used, and a boat on which two or more of the semiconductor substrates have been arranged is placed in a furnace which is a reaction chamber. At this time, by supplying, for example, a SiH$_4$ (silane) gas in the furnace as a film forming gas, and supplying a chlorine atom-containing gas as an etching gas, the epitaxial growth process is performed. For the chlorine atom-containing gas which is the etching gas, HCl (hydrochloric acid) gas or Cl (chlorine) gas can be used, for example.

Next, as illustrated in FIG. 17, the gate protection film GD and the sidewall SW1 which are formed of silicon nitride in the SOI transistor and the gate protection film GD formed of silicon nitride in the bulk transistor are removed selectively by cleaning by, for example, hot phosphoric acid. At this time, also a thickness of the offset spacer OF2 formed of silicon oxide in the SOI transistor and the offset spacer OF2 formed of silicon oxide in the bulk transistor may become thin. In addition, in the SOI region 1A, the semiconductor layer SL is exposed between the gate electrode GE and the epitaxial layer EP.

Next, as illustrated in FIG. 18, after a silicon nitride film of, for example, about 10 nm thick is deposited by, for example, the CVD method, this silicon nitride film is processed selectively by, for example, the anisotropic dry etching method. Thus, on the side walls of the gate electrode GE in the SOI transistor and the side walls of the gate electrode GE in the bulk transistor, an offset spacer OF3 formed of silicon nitride is formed via the offset spacers OF1 and OF2.

Here, as described using the FIG. 4, in the n-channel SOI transistor, a width Lo1 of a sum total of three layers of the offset spacers OF1, OF2 and OF3 which are formed on the side walls of the gate electrode GE is configured so as to be larger than or equal to a thickness of the semiconductor layer SL and smaller than or equal to a thickness of a sum total of the semiconductor layer SL and the insulation film EX. Preferably, the above-mentioned width Lo1 is configured so as to be the same value as a thickness of the semiconductor layer SL.

Next, as illustrated in FIG. 19, a photoresist pattern RP4 is formed on the region in which the p-channel SOI transistor is formed in the SOI region 1A and in the bulk region 1B by, for example, the lithography technology. Subsequently, with the photoresist pattern RP4 as a mask, an n-type impurity, for example, an As (arsenic) ion, is ion-implanted in the SOI region 1A in which the n-channel SOI transistor is formed. Thus, in the n-channel SOI transistor, at the same time an n-type impurity is ion-implanted into the epitaxial layer EP, an n-type impurity is ion-implanted into the exposed semiconductor layer SL on both sides of the gate electrode GE or the semi conductor layer SL and the insulation film BX which are exposed on both sides of the gate electrode GE, and an n-type extension layer EAn is formed.

Then-type extension layer EAn is formed by adjusting the width Lo1 of a sum total of three layers of the offset spacers OF1, OF2 and OF3 which are formed on the side walls of the gate electrode GE and ion implantation conditions (acceleration energy and implant amount) of an n-type impurity. Thus, in the n-channel SOI transistor, overlapping (gate overlapping) between the gate electrode GE and the n-type extension layer EAn can be optimized.

Subsequently, the photoresist pattern RP4 is removed.

Next, as illustrated in FIG. 20, after a silicon oxide film of, for example, about 10 nm thick is deposited by, for example, the CVD method, this silicon oxide film is processed selectively by, for example, the anisotropic dry etching method. Thus, on the side walls of the gate electrode GE in the SOI region 1A and the side walls of the gate electrode GE in the bulk region 1B, an offset spacer OF4 formed of silicon oxide is formed via the offset spacers OF1, OF2 and OF3.

Here, as described using the FIG. 4, in the p-channel SOI transistor, a width Lo2 of the sum total of four layers of the offset spacers OF1, OF2, OF3 and OF4 which are formed on the side walls of the gate electrode GE is configured so as to be larger than or equal to a thickness of the semiconductor layer SL and smaller than or equal to a thickness of a sum total of the semiconductor layer SL and the insulation film BX. Preferably, the above-mentioned width Lo2 is configured so as to be the same value as a thickness of a sum total of the semiconductor layer SL and the insulation film BX.

Next, as illustrated in FIG. 21, a photoresist pattern RP5 is formed on the region in which the n-channel SOI transistor is formed in the SOI region 1A and the bulk region 1B by, for example, the lithography technology. Subsequently, with the photoresist pattern RP5 as a mask, a p-type impurity, for example, a B (boron) ion, is ion-implanted in the SOI region 1A in which the p-channel SOI transistor is formed. Thus, in the p-channel SDI transistor, at the same time a p-type impurity is ion-implanted into the epitaxial layer EP, a p-type impurity is ion-implanted into the semiconductor layer SL exposed on both sides of the gate electrode GE or the semiconductor layer SL and the insulation film BX which are exposed on both sides of the gate electrode GE, and a p-type extension EAp is formed.

The p-type extension layer EAp is formed by adjusting the width Lo2 of a sum total of four layers of the offset spacers OF1, OF2, OF3 and OF4 which are formed on the side walls of the gate electrode GE and ion implantation conditions (acceleration energy and implant amount) of an p-type impurity. Thus, in the p-channel SOI transistor, overlapping (gate overlapping) between the gate electrode GE and the p-type extension layer EAp can be optimized.

Subsequently, the photoresist pattern RP5 is removed.

Next, as illustrated in FIG. 22, after a silicon nitride film of, for example, about 40 nm thick is deposited by, for example, the CVD method, this silicon nitride film is processed selectively by, for example, the anisotropic dry etching method. Thus, on the side walls of the gate electrode GE in the SOI transistor and the side walls of the gate electrode GE in the bulk transistor, a sidewall SW2 formed of silicon nitride is formed via the offset spacers OF1, OF2, OF3 and OF4. At this time, in the SOI region 1A, an upper part of the semiconductor layer SL which has been exposed between the gate electrode GE and the epitaxial layer EP is covered by the sidewall SW2.

Next, as illustrated in FIG. 23, a photoresist pattern RP6 is formed on the region in which the p-channel SOI transistor is formed in the SOI region 1A and the region in which the p-channel bulk transistor is formed in the bulk region 1B by, for example, the lithography technology. Subsequently, with the photoresist pattern RP6 as a mask, an n-type impurity, for example, an As (arsenic) ion, is ion-implanted in the region in which the n-channel SOI transistor is formed in the SOI region 1A and the region in which the n-channel bulk transistor is formed in the bulk region 1B. Thus, in the n-channel SOI transistor, an n-type diffusion layer SDn1 is formed in the epitaxial layer EP and the semiconductor layer SL under the epitaxial layer EP, and in the n-channel bulk transistor, an n-type diffusion layer SDn2 is formed in the semiconductor substrate SB on both sides of the gate electrode GE.

Subsequently, the photoresist pattern RP6 is removed.

Next, as illustrated in FIG. 24, a photoresist pattern RP7 is formed on the region in which the n-channel SOI transistor is formed in the SOI region 1A and the region in which the n-channel bulk transistor is formed in the bulk region 1B by, for example, the lithography technology. Subsequently, with the photoresist pattern RP7 as a mask, in the region which the p-channel SOI transistor is formed in the SOI region 1A and the region in which the p-channel bulk transistor is formed in the bulk region 1B, a p-type impurity, for example, a BF2 (fluoride boron) ion, is ion-implanted. Thus, in the p-channel SOI transistor, an n-type diffusion layer SDp1 is formed in the epitaxial layer EP and the semiconductor layer SL under the epitaxial layer EP, and in the p-channel bulk transistor, a p-type diffusion layer SDp2 is formed in the semiconductor substrate SB on both sides of the gate electrode GE.

Subsequently, the photoresist pattern RP7 is removed.

Subsequently, an impurity implanted by, for example, an RTA (Rapid Thermal Anneal) method is made to be activated and thermally diffused. As conditions for the RTA, for example, nitrogen atmosphere and 1050° C. can be exemplified.

At this time, although also the n-type extension layer EAn of the n-channel SOI transistor is thermally diffused, a diffusion distance, etc. due to the thermal diffusion are taken into consideration in advance, and a thickness of the offset spacers OF1, OF2 and OF3 formed on the side walls of the gate electrode GE and ion implantation conditions, etc. of an n-type impurity are made to have been configured. Thus, diffusion of the n-type extension layer EAn from a position lower than the end part of the gate electrode GE toward the channel and diffusion of the n-type extension layer EAn to the semiconductor substrate SB beyond the insulation film BX can be prevented.

In the same way, although also the n-type extension layer EAp of the p-channel SOI transistor is thermally diffused, a diffusion distance, etc. due to the thermal diffusion are taken into consideration in advance, and a thickness of the offset spacers OF1, OF2, OF3 and OF4 formed on the side walls of the gate electrode GE and ion implantation conditions, etc. of an p-type impurity are made to have been configured. Thus, diffusion of the p-type extension layer EAp from a position lower than the end part of the gate electrode GE toward the channel and diffusion of the p-type extension layer EAp to the semiconductor substrate SB beyond the insulation film BX can be prevented.

Next, as illustrated in FIG. 25, after a metal film, for example, a Ni (nickel) film of about 20 nm thick, is deposited by, for example, a spattering method, Ni (nickel) and Si (silicon) are made to be reacted by a heat treatment of, for example, about 320° C., and a nickel silicide layer NS is formed. Subsequently, after unreacted Ni (nickel) is removed by, for example, a mixed water solution of HCl (hydrochloric acid) and $H_2O_2$ (hydrogen peroxide solution), a phase of the nickel silicide layer NS is controlled by a heat treatment of, for example, about 550° C.

Thereby, in the SOI region 1A, the nickel silicide layer NS is formed on each upper part of the gate electrode GE and the epitaxial layer EP of the SOI transistor, and in the bulk region 1B, the nickel silicide layer NS is formed on each upper part of the gate electrode GE, the n-type diffusion layer SDn2 and the p-type diffusion layer SDp2 of the bulk transistor.

By the above-mentioned processes, in the SOI region 1A, the n-channel SOI transistor which has the source-drain (n-type extension layer EAn and n-type diffusion layer SDn1) and the gate electrode GE and the p-channel SOI transistor which has the source-drain (p-type extension layer EAp and p-type diffusion layer SDp1) and the gate electrode GE are formed. In addition, in the bulk region 1B, the n-channel bulk transistor which has the source-drain (n-type extension layer EBn and n-type diffusion layer SDn2) and the gate electrode GE and the p-channel bulk transistor which has the source-drain (p-type extension layer EBp and p-type diffusion layer SDp2) and the gate electrode CE are formed.

Next, as illustrated in FIG. 26, after an insulation film used as an etching stopper film formed of the silicon nitride film and an insulation film formed of the silicon oxide film are deposited one by one, and the interlayer insulation film IL is formed, the surface of the interlayer insulation film IL is planarized.

Next, as illustrated in FIG. 27, a contact hole (illustration is omitted) which penetrates the interlayer insulation film IL, and reaches the nickel silicide layer NS formed each in the upper part of the gate electrode GE of the SOI transistor and the bulk transistor, and a contact hole CNT which reaches the nickel silicide layer NS formed each in the upper part of the source-drain of the SOI transistor and the bulk transistor are formed.

Subsequently, a barrier conductor film including, for example, Ti (titanium) and a W (tungsten) film are formed one by one by, for example, the spattering method on the interlayer insulation film IL including the inside of the contact hole CNT. Subsequently, the barrier conductor film and the W (tungsten) film on the interlayer insulation film IL are removed by, for example, a CMP method, and a pillar-shaped contact plug CP where the W (tungsten) film is made to be a main conductor film is formed in the inside of the contact hole CNT.

Subsequently, a wiring layer which is electrically connected with the contact plug CP is formed, and wirings etc. in a further upper layer are formed, and thereby, the semiconductor device according to the present embodiment is completed mostly.

In this way, according to the present embodiment, in the fully-depleted SOI transistor, since overlapping (gate overlapping) between the gate electrode GE and the extension layer EX can be suppressed, reduction of a short channel effect, reduction of a leakage current (gate leakage current and GIDL) and reduction of a parasitic capacitance can be achieved. Therefore, reliability and performance of the semiconductor device which has the fully-depleted SOI transistor can be enhanced.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
    a first field effect transistor in a first region; and
    a second field effect transistor in a second region different from the first region,
    wherein the first field effect transistor comprises:
        an SOI substrate that includes a semiconductor substrate, an insulation film on the semiconductor substrate, and a semiconductor layer on the insulation film;
        a first gate electrode formed on the semiconductor layer via a first gate insulation film;
        a first offset spacer formed on side walls of the first gate electrode;
        a first extension layer of a first conductivity type that is formed on the semiconductor layer on both sides of the first gate electrode; and
        a first epitaxial layer of the first conductivity type for a source-drain formed on the semiconductor layer on which the first gate electrode and the first offset spacer are not formed,
    wherein the second field effect transistor comprises:
        the SOI substrate;
        a second gate electrode formed via a second gate insulation film on the semiconductor layer;
        a second offset spacer formed on side walls of the second gate electrode;
        a second extension layer of a second conductivity type that is different from the first conductivity type formed in the semiconductor layer on both sides of the second gate electrode; and
        a second epitaxial layer of the second conductivity type for a source-drain formed on the semiconductor layer on which the second gate electrode and the second offset spacer are not formed,
    wherein a width of the first offset spacer is larger than or equal to a thickness of the semiconductor layer and smaller than or equal to a thickness of a sum total of the semiconductor layer and the insulation film,
    wherein a width of the second offset spacer is larger than or equal to a thickness of the semiconductor layer and smaller than or equal to a thickness of a sum total of the semiconductor layer and the insulation film,
    wherein a depth of the second extension layer from an upper surface of the semiconductor layer is deeper than a depth of the first extension layer from an upper surface of the semiconductor layer,
    wherein the width of the first offset spacer is larger than the width of the second offset spacer, and
    wherein the second offset spacer is comprises of two or more layers.

2. The semiconductor device according to claim 1, wherein the first extension layer is distributed in the semiconductor substrate over an interface between the insulation film and the semiconductor substrate.

3. The semiconductor device according to claim 1, wherein the first conductivity type is an n-type, and the second conductivity type is a p-type.

4. The semiconductor device according to claim 1, wherein the second extension layer is not distributed in the semiconductor substrate over an interface between the insulation film and the semiconductor substrate.

5. The semiconductor device according to claim 1, further comprising:
    a third field effect transistor in a third region different from the first region and the second region,
    wherein the third field effect transistor comprises:
        the semiconductor substrate;
        a third gate electrode formed via a third gate insulation film on the semiconductor substrate;
        a third offset spacer formed on side walls of the third gate electrode; and
        a third extension layer of the first conductivity type formed on the semiconductor substrate on both sides of the third gate electrode, and
    wherein a semiconductor region of a second conductivity type that is different from the first conductivity type is formed in a channel side of the third extension layer.

6. The semiconductor device according to claim 5, wherein a thickness of the third gate insulation film is larger than a thickness of the first gate insulation film.

7. The semiconductor device according to claim 1, wherein the first offset spacer is consisted of one layer.

8. A semiconductor device comprising:
    a first field effect transistor in a first region; and
    a second field effect transistor in a second region different from the first region,
    wherein the first field effect transistor comprises:
        an SOI substrate that includes a semiconductor substrate, an insulation film on the semiconductor substrate, and a semiconductor layer on the insulation film;
        a first gate electrode formed on the semiconductor layer via a first gate insulation film;
        a first offset spacer formed on side walls of the first gate electrode;
        a first extension layer of a first conductivity type that is formed on the semiconductor layer on both sides of the first gate electrode; and a first epitaxial layer of the first conductivity type for a source-drain formed on the semiconductor layer on which the first gate electrode and the first offset spacer are not formed, wherein the second field effect transistor comprises:
the SOI substrate;
a second gate electrode formed via a second gate insulation film on the semiconductor layer;
a second offset spacer formed on side walls of the second gate electrode;
a second extension layer of a second conductivity type that is different from the first conductivity type formed in the semiconductor layer on both sides of the second gate electrode; and
a second epitaxial layer of the second conductivity type for a source-drain formed on the semiconductor layer on which the second gate electrode and the second offset spacer are not formed, wherein a width of the first offset spacer is larger than or equal to a thickness of the semiconductor layer and smaller than or equal to a thickness of a sum total of the semiconductor layer and the insulation film, wherein a width of the second offset spacer is larger than or equal to a thickness of the semiconductor layer and smaller than or equal to a thickness of a sum total of the semiconductor layer and the insulation film, wherein the width of the first offset spacer is larger than the width of the second offset spacer, and wherein a depth of the second extension layer from an upper surface of the semiconductor layer is deeper than a depth of the first extension layer from an upper surface of the semiconductor layer.

9. The semiconductor device according to claim 8, wherein the first extension layer is distributed in the semiconductor substrate over an interface between the insulation film and the semiconductor substrate.

10. The semiconductor device according to claim 8, wherein the first conductivity type is an n-type, and the second conductivity type is a p-type.

11. The semiconductor device according to claim 8, wherein the second extension layer is not distributed in the semiconductor substrate over an interface between the insulation film and the semiconductor substrate.

12. The semiconductor device according to claim 8, further comprising:
a third field effect transistor in a third region different from the first region and the second region,
wherein the third field effect transistor comprises:
the semiconductor substrate;
a third gate electrode formed via a third gate insulation film on the semiconductor substrate;
a third offset spacer formed on side walls of the third gate electrode; and
a third extension layer of the first conductivity type formed on the semiconductor substrate on both sides of the third gate electrode, and
wherein a semiconductor region of a second conductivity type that is different from the first conductivity type is formed in a channel side of the third extension layer.

13. The semiconductor device according to claim 12, wherein a thickness of the third gate insulation film is larger than a thickness of the first gate insulation film.

14. The semiconductor device according to claim 8, wherein the second offset spacer is comprised of two or more layers.

15. The semiconductor device according to claim 14, wherein the first offset spacer is consisted of one layer.

16. A semiconductor device comprising:
a first field effect transistor in a first region; and
a second field effect transistor in a second region different from the first region,
wherein the first field effect transistor comprises:
an SOI substrate that includes a semiconductor substrate, an insulation film on the semiconductor substrate, and a semiconductor layer on the insulation film;
a first gate electrode formed on the semiconductor layer via a first gate insulation film;
a first offset spacer formed on side walls of the first gate electrode;
a first extension layer of a first conductivity type that is formed on the semiconductor layer on both sides of the first gate electrode; and
a first epitaxial layer of the first conductivity type for a source-drain formed on the semiconductor layer on which the first gate electrode and the first offset spacer are not formed, wherein the second field effect transistor comprises:
the SOI substrate;
a second gate electrode formed via a second gate insulation film on the semiconductor layer;
a second offset spacer formed on side walls of the second gate electrode;
a second extension layer of a second conductivity type that is different from the first conductivity type formed in the semiconductor layer on both sides of the second gate electrode; and
a second epitaxial layer of the second conductivity type for a source-drain formed on the semiconductor layer on which the second gate electrode and the second offset spacer are not formed, wherein a width of the first offset spacer is larger than or equal to a thickness of the semiconductor layer and smaller than or equal to a thickness of a sum total of the semiconductor layer and the insulation film, wherein a width of the second offset spacer is larger than or equal to a thickness of the semiconductor layer and smaller than or equal to a thickness of a sum total of the semiconductor layer and the insulation film, wherein a depth of the second extension layer from an upper surface of the semiconductor layer is deeper than a depth of the first extension layer from an upper surface of the semiconductor layer, wherein the width of the first offset spacer is larger than the width of the second offset spacer, wherein the second offset spacer is comprised of two or more layers, and wherein the first offset spacer is consisted of one layer.

* * * * *